United States Patent
Nonaka et al.

(10) Patent No.: US 10,483,482 B2
(45) Date of Patent: Nov. 19, 2019

(54) DISPLAY APPARATUS

(71) Applicant: TIANMA JAPAN, LTD., Kawasaki, Kanagawa (JP)

(72) Inventors: Yoshihiro Nonaka, Kawasaki (JP); Jiro Yanase, Kawasaki (JP); Kenichi Takatori, Kawasaki (JP)

(73) Assignee: TIANMA MICROELECTRONICS CO., LTD., Longhua District, Chenzhen (CN)

( * ) Notice: Subject to any disclaimer, the term of this patent is extended or adjusted under 35 U.S.C. 154(b) by 51 days.

(21) Appl. No.: 15/667,746

(22) Filed: Aug. 3, 2017

(65) Prior Publication Data

US 2018/0040845 A1 Feb. 8, 2018

(30) Foreign Application Priority Data

Aug. 5, 2016 (JP) .................................. 2016-155047
Apr. 4, 2017 (JP) .................................. 2017-074731

(51) Int. Cl.
| | | |
|---|---|---|
| *A61K 38/12* | (2006.01) | |
| *H01L 51/52* | (2006.01) | |
| *H01L 51/10* | (2006.01) | |
| *H01L 27/105* | (2006.01) | |
| *H01L 51/05* | (2006.01) | |

(52) U.S. Cl.
CPC ........ *H01L 51/5206* (2013.01); *H01L 51/102* (2013.01); *H01L 27/105* (2013.01); *H01L 51/05* (2013.01)

(58) Field of Classification Search
CPC ...... A61K 38/12; A61K 38/16; A61K 38/168; A61K 45/06; A61K 51/08; C07K 14/00; C07K 14/415; G01N 33/5023; H01L 27/105; H01L 51/05; H01L 51/102; H01L 51/5206
USPC ......................................... 345/214
See application file for complete search history.

(56) References Cited

U.S. PATENT DOCUMENTS

| | | |
|---|---|---|
| 6,229,506 B1 | 5/2001 | Dawson et al. |
| 6,937,215 B2 | 8/2005 | Lo |
| 8,502,757 B2 | 8/2013 | Liu et al. |
| 2005/0017934 A1 | 1/2005 | Chung et al. |
| 2010/0020065 A1* | 1/2010 | Takasugi ............... G09G 3/3233 345/214 |
| 2016/0217735 A1* | 7/2016 | Park ..................... G09G 3/3233 |

FOREIGN PATENT DOCUMENTS

| | | |
|---|---|---|
| JP | 2005-031630 A | 2/2005 |
| JP | 2013-210407 A | 10/2013 |

* cited by examiner

*Primary Examiner* — Tony O Davis
(74) *Attorney, Agent, or Firm* — Sughrue Mion, PLLC

(57) ABSTRACT

Provided is a display apparatus that compensates a drive transistor threshold to attain a highly precise structure. The display apparatus comprises a light emitting element including a first electrode, a second electrode and an organic light emitting layer disposed between the first electrode and the second electrode, and a pixel circuit including a capacitor and a drive transistor letting current according to voltage of the capacitor flow in the light emitting element. The pixel circuit stops supply of current to the light emitting element while connecting the capacitor to the first electrode.

15 Claims, 19 Drawing Sheets

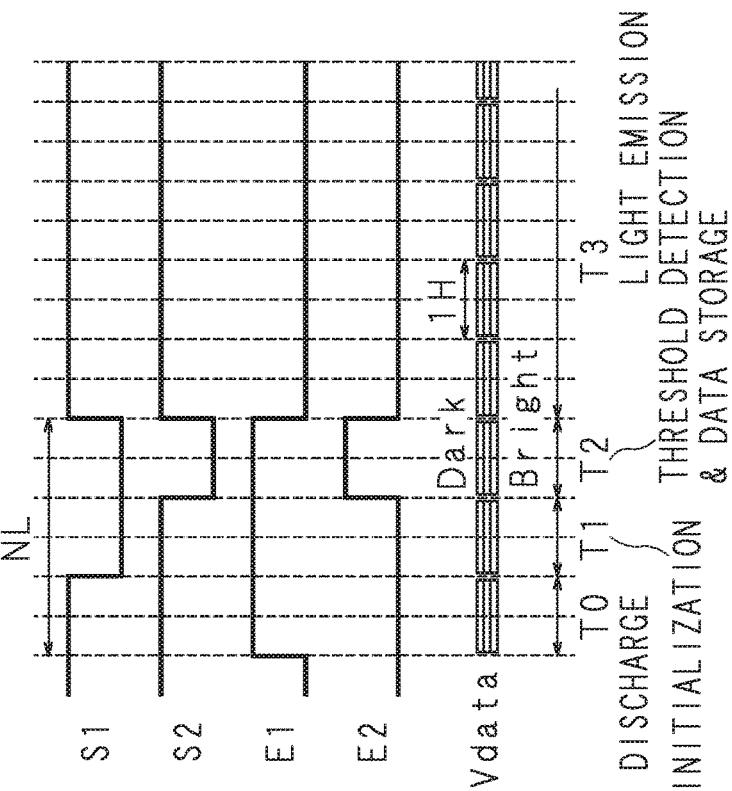
FIG. 4A
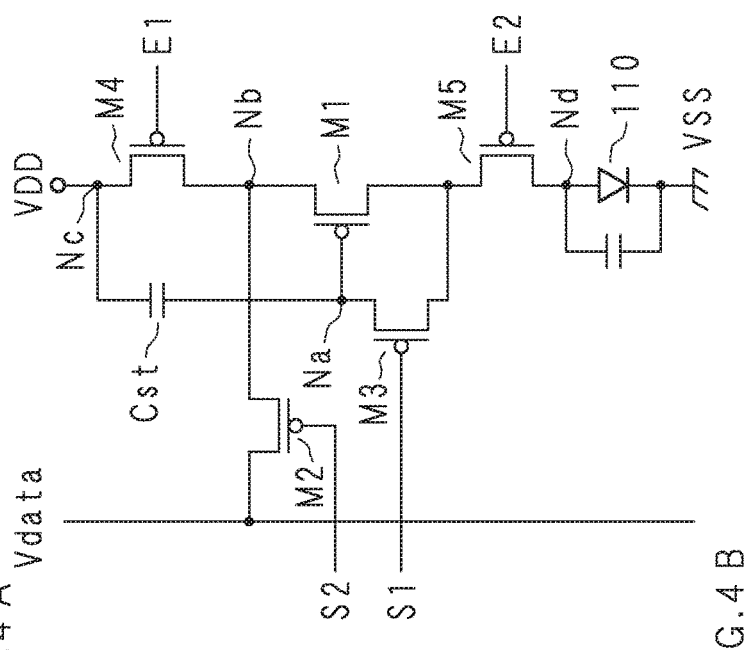
FIG. 4B
| SWITCH (SIGNAL) | DISCHARGE | INITIALIZATION | THRESHOLD DETECTION & DATA STORAGE | LIGHT EMISSION |
|---|---|---|---|---|
| M3 (S1) | OFF | ON | ON | OFF |
| M2 (S2) | OFF | OFF | ON | OFF |
| M4 (E1) | OFF | OFF | OFF | ON |
| M5 (E2) | ON | ON | OFF | ON |
FIG. 4C

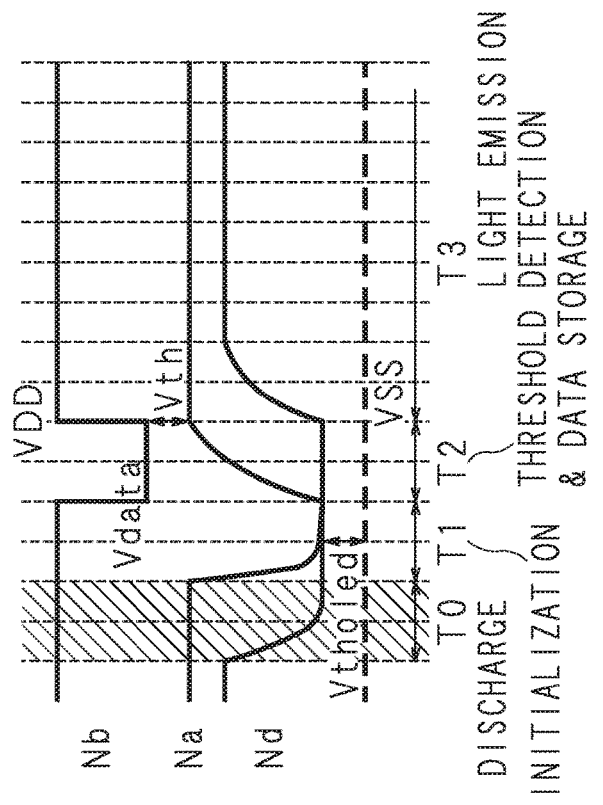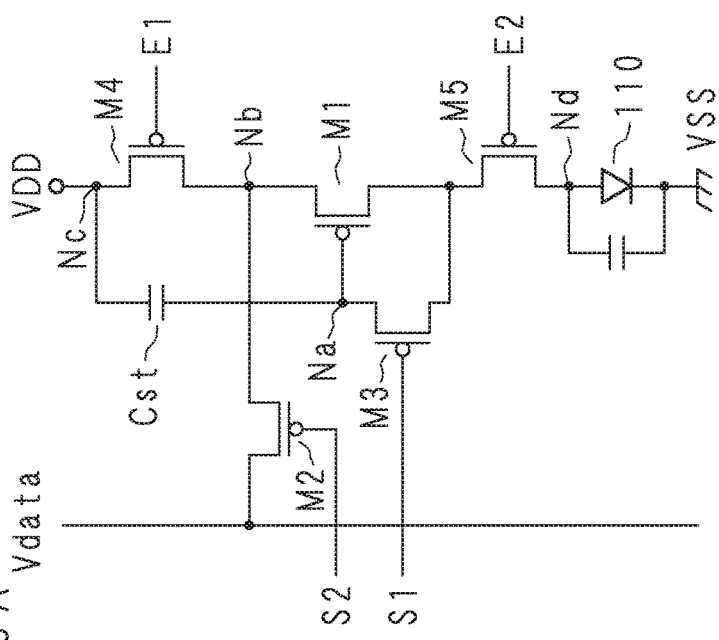

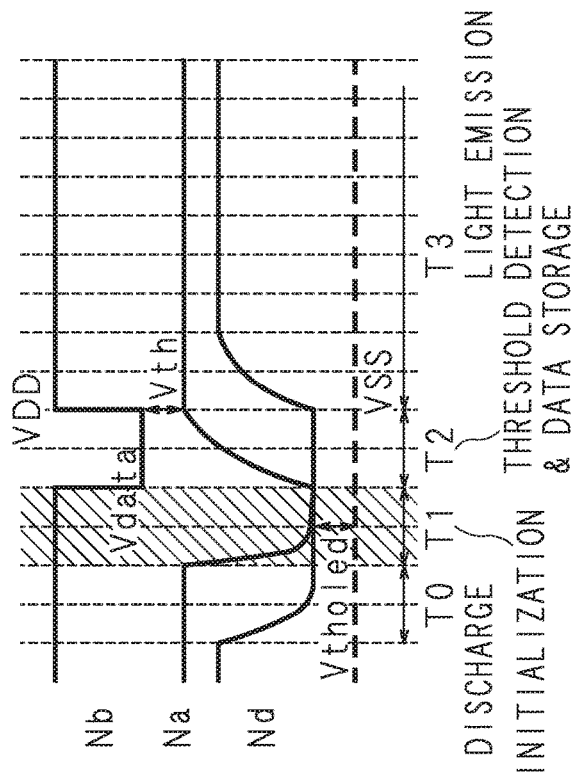
FIG. 6A
FIG. 6B
| SWITCH (SIGNAL) | INITIALIZATION |
|---|---|
| M3 (S1) | ON |
| M2 (S2) | OFF |
| M4 (E1) | OFF |
| M5 (E2) | ON |
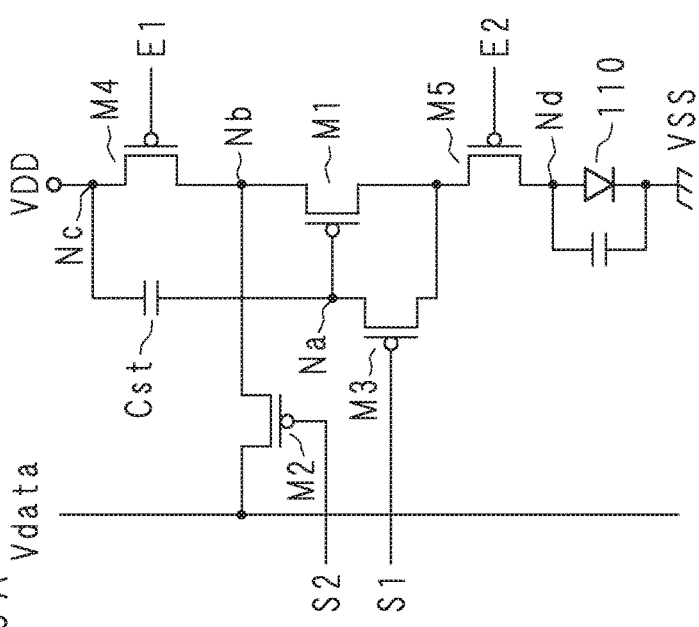
FIG. 6C

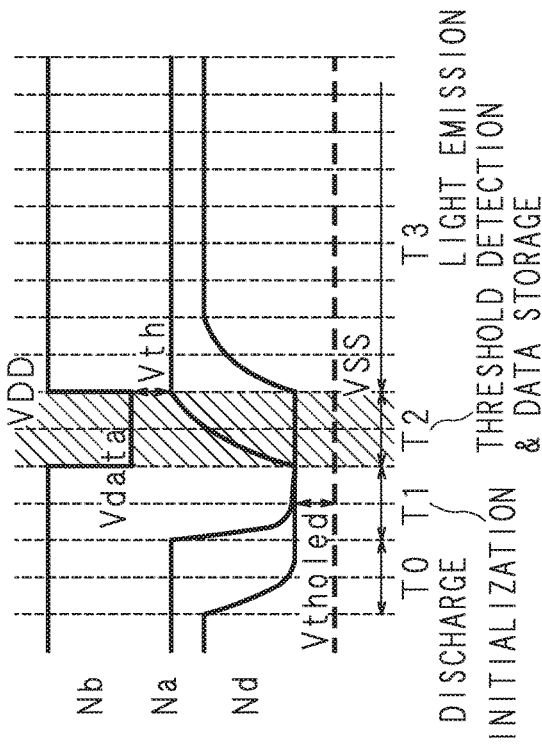
FIG. 7A
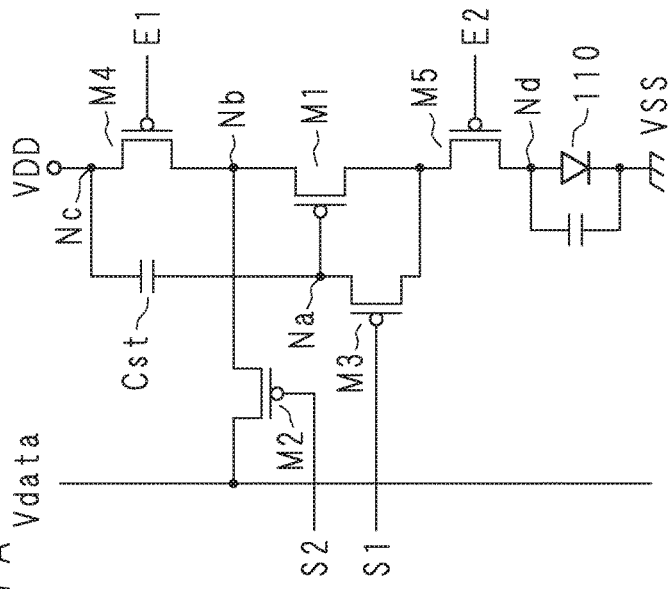
FIG. 7C
| SWITCH (SIGNAL) | THRESHOLD DETECTION & DATA STORAGE |
|---|---|
| M3 (S1) | ON |
| M2 (S2) | ON |
| M4 (E1) | OFF |
| M5 (E2) | OFF |
FIG. 7B

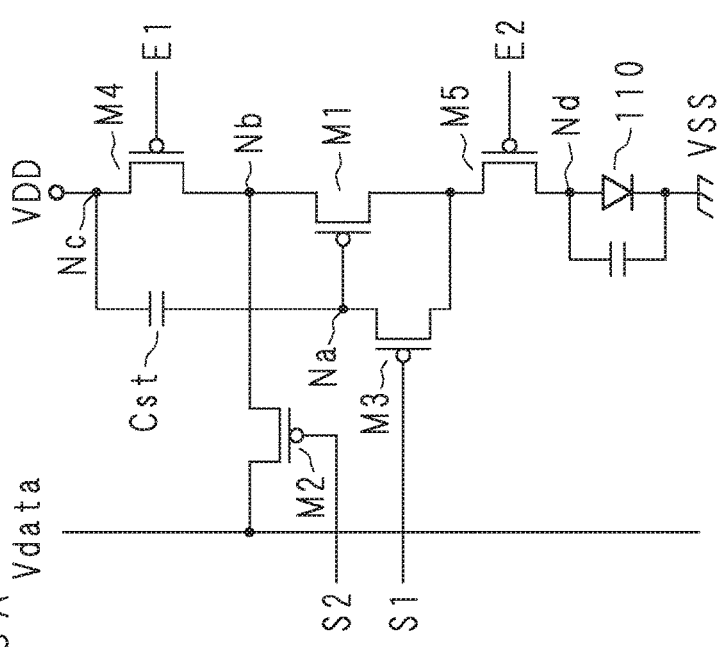
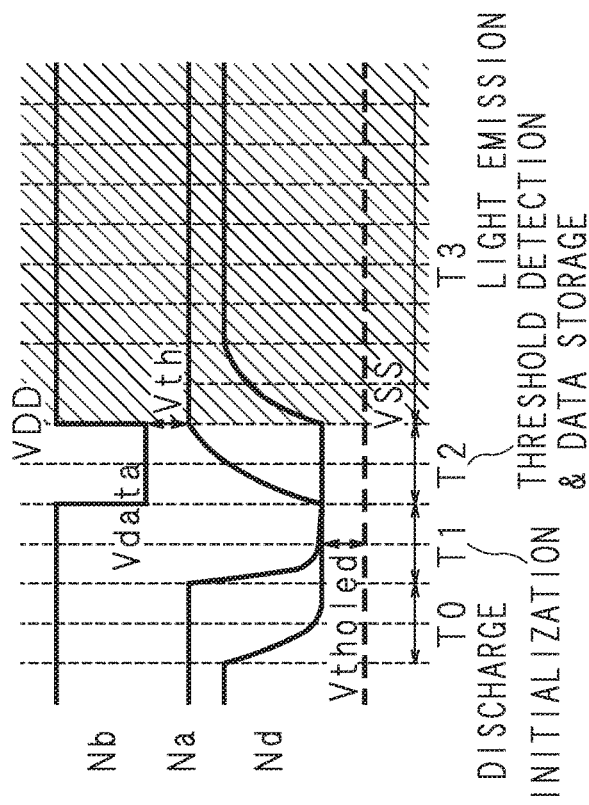

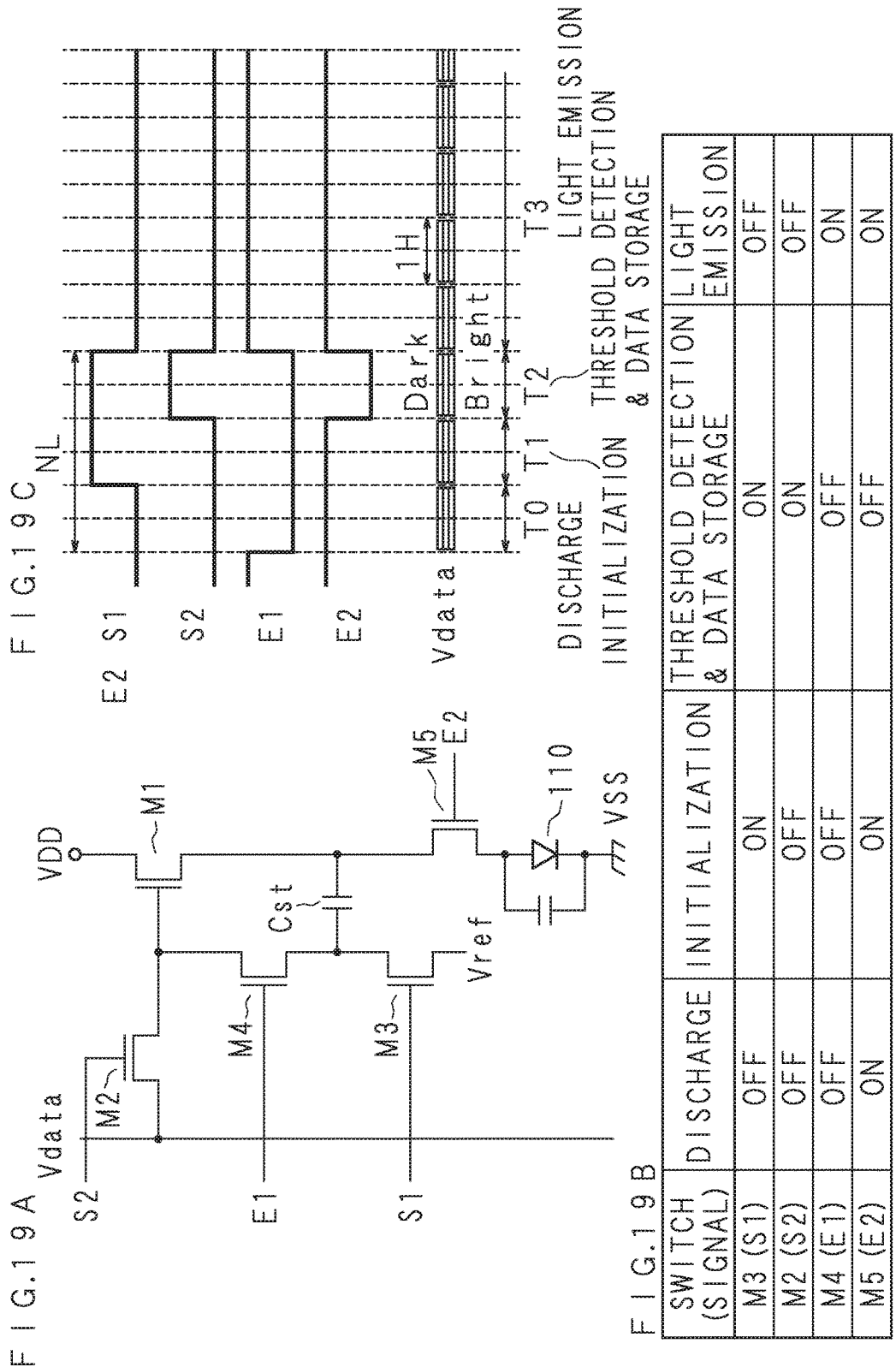

DISPLAY APPARATUS

CROSS-REFERENCE TO RELATED APPLICATIONS

This non-provisional application claims priority under 35 U.S.C. § 119(a) on Patent Application No. 2016-155047 filed in Japan on Aug. 5, 2016 and Patent Application No. 2017-74731 filed in Japan on Apr. 4, 2017, the entire contents of which are hereby incorporated by reference.

FIELD

The present invention relates to a display apparatus.

BACKGROUND

In recent years, a display apparatus employing, for example, an organic light emitting diode (OLED) as a light emitting element has been proposed. The OLED is a display element of a so-called current driven type where luminance changes depending on a current value. Each pixel in such a display apparatus includes an OLED and a pixel circuit that controls the emission luminance of the OLED. The pixel circuit includes, for example, a drive transistor that controls current supplied to the OLED. A configuration has been proposed that compensates differences and variations in the threshold voltage of the drive transistor in this type of pixel circuit (see Japanese Patent Application Laid-Open Publication No. 2005-31630, for example).

SUMMARY

It is, however, necessary to prepare a large number of transistors in a pixel circuit in order to compensate the threshold of the drive transistor with high precision. As the number of transistors is increased, the area of the pixel circuit is also increased accordingly. This results in increase of the area of each pixel, making it difficult to have a highly precise structure. An aspect of the present disclosure aims to provide a display apparatus that attains a highly precise structure.

A display apparatus according to one aspect of the present disclosure comprises: a light emitting element including a first electrode, a second electrode and an organic light emitting layer disposed between the first electrode and the second electrode; and a pixel circuit including a capacitor and a drive transistor letting current according to the voltage of the capacitor flow in the light emitting element. The pixel circuit stops supplying current to the light emitting element while connecting the capacitor to the first electrode.

According to one aspect of the present disclosure, a highly precise structure may be attained in the display apparatus.

BRIEF DESCRIPTION OF THE DRAWINGS

FIGS. 4A to 4C illustrate the operation of the pixel circuit according to the first embodiment.
FIGS. 5A to 5C illustrate the operation of the pixel circuit during different operation periods.
FIGS. 6A to 6C illustrate the operation of the pixel circuit during different operation periods.
FIGS. 7A to 7C illustrate the operation of the pixel circuit during different operation periods.
FIGS. 8A to 8C illustrates the operation of the pixel circuit during different operation periods.
FIGS. 19A to 19C illustrate the operation of the pixel circuit according to the fourth embodiment.

DETAILED DESCRIPTION

Embodiments will be described below in detail with reference to the drawings. It is noted that the ordinal numbers such as "first," "second" and so forth in the specification and claims are added for the purpose of clarifying the relationship between elements and preventing the mix-up thereof. These ordinal numbers are therefore not to limit the number of elements.

Figure 1:
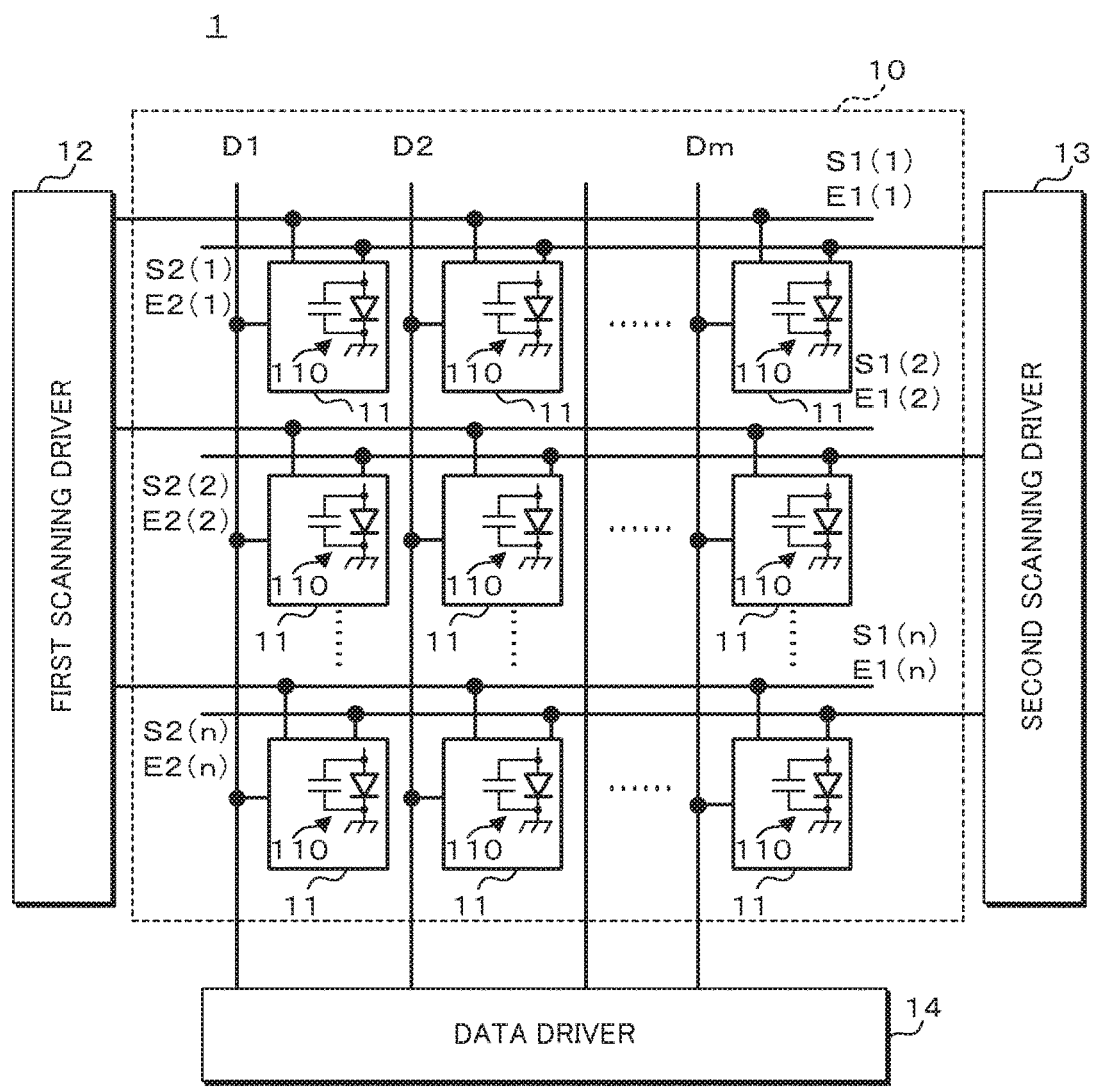
FIG. 1 is a block diagram illustrating a configuration example of a display apparatus.

In the description below, an OLED display apparatus employing an organic light emitting diode (OLED) as a light emitting element will be described. FIG. 1 is a block diagram illustrating a configuration example of a display apparatus. A display apparatus 1 includes pixel circuits 11, a first scanning driver 12, a second scanning driver 13 and a data driver 14. The display apparatus 1 includes multiple pixel circuits 11.

The multiple pixel circuits 11 are arrayed in matrix in an active matrix section 10. According to the present embodiment, the pixel circuits 11 are arrayed in the matrix of n rows and m columns (n and m are integers larger than 1). Each of the pixel circuits 11 includes an OLED element 110. The first scanning driver 12 and the second scanning driver 13 output control signals. In the present embodiment, the control signals include four signals. The first scanning driver 12 outputs control signals S1 and E1. The second scanning driver 13 outputs control signals S2 and E2. Each of the control signals S1, S2, E1 and E2 is a signal of n bits. The control signals S1 and S2 are also called scanning signals. The control signals E1 and E2 are also called light emission control signals.

The bits in the control signals S1, S2, E1 and E2 are outputted to the pixel circuits 11 in different rows. The control signal S2 serves to select the pixel circuit 11 in a predetermined row as a circuit for accepting a data signal (so-called pixel circuit to be scanned). The data driver 14 outputs a data signal according to the emission luminance to a data line, for a pixel in a row selected in accordance with the control signals S1, S2, E1 and E2.

Figure 2A:
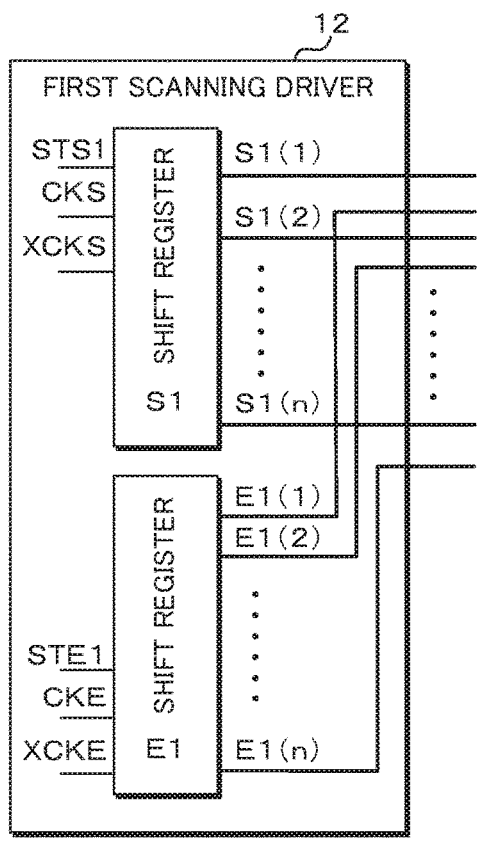
FIGS. 2A and 2B are block diagrams illustrating the configuration of a first scanning driver and a second scanning driver.
Figure 2B:
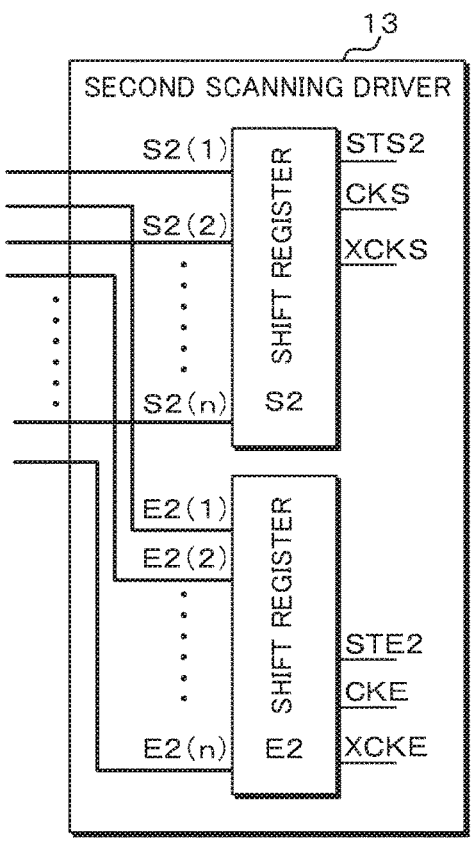

FIGS. 2A and 2B are block diagrams illustrating the configuration of a first scanning driver 12 and a second scanning driver 13. FIG. 2A illustrates the configuration of the first scanning driver 12. The first scanning driver 12 includes a shift register S1 and a shift register E1. Each of the shift register S1 and the shift register E1 is a shift register of n bits.

The shift register S1 operates in accordance with a control signal STS1 as well as two-phase clock signals CKS and XCKS. The shift register S1 outputs the control signal S1 of n bits. The shift register E1 operates in accordance with a control signal STE1 as well as two-phase clock signals CKE and XCKE. The shift register E1 outputs the control signal E1 of n bits.

FIG. 2B illustrates the configuration of the second scanning driver 13. The second scanning driver 13 includes a shift register S2 and a shift register E2. Each of the shift register S2 and the shift register E2 is a shift register of n bits. The shift register S2 operates in accordance with a control signal STS2 as well as two-phase clock signals CKS and XCKS. The shift register S2 outputs the control signal S2 of n bits. The shift register E2 operates in accordance with a control signal STE2 as well as two-phase clock signals CKE and XCKE. The shift register E2 outputs the control signal E2 of n bits.

(First Embodiment)

Figure 3:
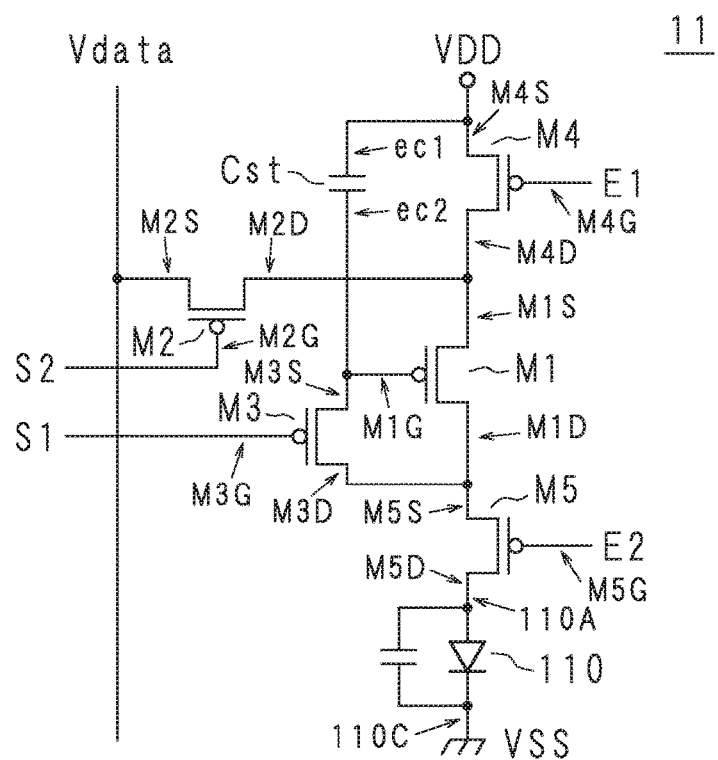
FIG. 3 is a circuit diagram illustrating a configuration example of a pixel circuit according to the first embodiment.

FIG. 3 is a circuit diagram illustrating a configuration example of a pixel circuit 11 according to the first embodiment. The pixel circuit 11 includes five transistors M1 to M5, a capacitor Cst and a light emitting element 110. Each of the transistors M1 to M5 is, for example, a thin film transistor (TFT). The capacitor Cst is a so-called storage capacitor or retention capacitor. The capacitor Cst retains a voltage according to a data signal. The light emitting element 110 is an OLED element. In FIG. 3, the light emitting element 110 shows an equivalent circuit of an OLED element. This equivalent circuit is a parallel circuit of a light emitting diode and a capacitor.

The transistor M1 is also called a drive transistor, which controls drive current flowing in the light emitting element 110. The transistors M2 to M5 are switch transistors. By switching the transistors M2 to M5 between ON and OFF, the state of the pixel circuit 11 makes a transition. A source M1S of the transistor M1 is connected to a power supply line VDD via the transistor M4. The source M1S is also connected to a data line Vdata via the transistor M2. The data line Vdata corresponds to any one of data lines D1 to Dm in FIG. 1. A drain M1D of the transistor M1 is connected to an anode 110A of the light emitting element 110 via the transistor M5. A gate M1G of the transistor M1 is connected to one electrode ec2 of the capacitor Cst. The gate M1G is also connected to a source M3S of the transistor M3.

A source M2S of the transistor M2 is connected to the data line Vdata. A drain M2D of the transistor M2 is connected to the source M1S of the transistor M1 and to a drain M4D of the transistor M4. The control signal S2 is inputted to the gate M2G of the transistor M2. A drain M3D of the transistor M3 is connected to the drain M1D of the transistor M1 and to a source M5S of the transistor M5. The control signal S1 is inputted to a gate M3G of the transistor M3. The control signal E1 is inputted to a gate M4G of the transistor M4. A drain M5D of the transistor M5 is connected to the anode 110A of the light emitting element 110. The control signal E2 is inputted to a gate M5G of the transistor M5. A cathode 110C of the light emitting element 110 is connected to a power supply line VSS.

The configuration and operation of the display apparatus 1 according to the present embodiment will now be described below. The display apparatus 1 comprises the light emitting element 110, the capacitor Cst and the pixel circuit 11. The light emitting element 110 comprises the first electrode 110A, the second electrode 110C, and an organic light emitting layer disposed between the first electrode 110A and the second electrode 110C. The pixel circuit 11 comprises the capacitor Cst and the drive transistor M1 letting current according to the voltage of the capacitor Cst flow in the light emitting element 110. Furthermore, the pixel circuit 11 stops supplying current to the light emitting element 110 while connecting the capacitor Cst to the first electrode 110A. An example of the first electrode 110A is an anode electrode 110A of the light emitting element 110. An example of the second electrode 110C is a cathode electrode 110C of the light emitting element 110. An example of the capacitor is the capacitor Cst according to the present embodiment. An example of the drive transistor is the transistor M1 of the present embodiment.

The drive transistor M1 includes the third electrode M1S and the fourth electrode M1D, and controls the current flowing between the third electrode M1S and the fourth electrode M1D in accordance with the voltage applied to the gate M1G.

The pixel circuit 11 further includes the first to third control elements each of which has the fifth electrode and the sixth electrode and which controls the conduction state of the fifth electrode and the sixth electrode. The fifth electrode M4S of the first control element M4 is connected to the first power supply VDD which supplies current to flow in the light emitting element 110, whereas the sixth electrode M4D of the first control element M4 is connected to the third electrode M1S. An example of the first control element M4 is the transistor M4. The fifth electrode M3S of the second control element M3 is connected to the gate M1G and the capacitor Cst, whereas the sixth electrode M3D of the second control element M3 is connected to the fourth electrode M1D. An example of the second control element is the transistor M3. The fifth electrode M5S of the third control element M5 is connected to the fourth electrode M1D and to the sixth electrode M3D of the second control element M3, and the sixth electrode M5D of the third control element M5 is connected to the first electrode 110A. An example of the third control element is the transistor M5. The pixel circuit 11 includes the seventh electrode M2S connected to the data line which supplies data voltage according to the emission luminance of the light emitting element 110 and the eighth electrode M2D connected to the third electrode M1S, and comprises the fourth control element M2 controlling the conduction state of the seventh electrode M2S and the eighth electrode M2D. An example of the fourth control element is the transistor M2.

The capacitor includes the third electrode and the fourth electrode which is connected to a predetermined potential. An example of the capacitor is the capacitor Cst. The pixel circuit 11 connects the first electrode to the third electrode. An example of the third electrode is one electrode ec2 of the capacitor Cst. An example of the fourth electrode is the other electrode ec1 of the capacitor Cst. The third electrode is also referred to as the ninth electrode. The fourth electrode is also referred to as the tenth electrode.

The operation of the pixel circuit 11 will now be described with reference to FIGS. 4A to 8C. In FIGS. 4A to 8C, reference codes for the electrodes illustrated in FIG. 3 are not indicated. FIGS. 4A to 4C illustrate the operation of the pixel circuit 11. FIG. 4A illustrates a pixel circuit 11 similar to that in FIG. 3. FIG. 4A is a circuit diagram of the pixel circuit 11, illustrating nodes Na to Nd that will be used in the description below. The node Na is a node connected to the gate M1G of the transistor M1, to one electrode ec2 of the capacitor Cst, and to the source M3S of the transistor M3. The node Nb is a node connected to the source M1S of the transistor M1, to the drain M2D of the transistor M2, and to the drain M4D of the transistor M4. The node Nc is a node connected to the source M4S of the transistor M4, to the other electrode ec1 of the capacitor Cst, and to the power supply line VDD. The node Nd is a node connected to the drain M5D of the transistor M5 and to the anode 110A of the light emitting element 110.

The operation of the pixel circuit 11 may be divided into four periods. The pixel circuit 11 repeats the operation while setting four periods as one cycle. FIG. 4B is a table illustrating the relationship of ON and OFF in the transistors M2 to M5 during different periods for the pixel circuit 11. The four periods include a discharge period, an initialization period, a threshold detection and data storage period (also indicated as threshold detection & data storage period), and a light emission period. In the discharge period, the transistors M3, M2 and M4 are OFF. The transistor M5 is ON. In the initialization period, the transistors M3 and M5 are ON. The transistors M2 and M4 are OFF. In the threshold detection & data storage period, the transistors M3 and M2 are ON. The transistors M4 and M5 are OFF. In the light emission period, the transistors M3 and M2 are OFF. The transistors M4 and M5 are ON.

FIG. 4C is a graph illustrating changes in control signals in the different operation periods for the pixel circuit 11 and a data signal in time series. The horizontal axis indicates time. The time width 1 H indicates one horizontal period. The vertical axis indicates potential. Each of the control signals S1, S2, E1 and E2 is an active low signal. That is, when the control signals S1, S2, E1 and E2 have the values of high (H), the respective transistors M3, M2, M4 and M5 are OFF accordingly. When the control signals S1, S2, E1 and E2 have the values of low (L), the respective transistors M3, M2, M4 and M5 are ON accordingly. Vdata indicates a change in the data signal potential. Vdata is updated every 1 H of one horizontal period. A period T0 indicated in FIG. 4C represents the discharge period. A period T1 represents the initialization period. A period T2 represents the threshold detection & data storage period. A period T3 represents the light emission period. The periods from T0 to T2 correspond to a non-emission period NL during which no light is emitted from the light emitting element 110. Each of the periods T0, T1 and T2, i.e. periods excluding the period T3, has the same length as one horizontal period. The length of each of the periods T0, T1 and T2 may alternatively be longer than one horizontal period, not limited to the example above. The length of each of the periods T0, T1 and T2 may also be shorter than one horizontal period.

FIGS. 5A to 8C illustrate the operation of the pixel circuit 11 during the different operation periods. FIGS. 5A to 8A again illustrate the circuit diagrams of the pixel circuit 11. FIGS. 5B to 8B are tables illustrating the ON/OFF states of the transistors M2 to M5. FIGS. 5C to 8C are graphs illustrating the time changes of the potentials of the nodes Na, Nb and Nd.

FIGS. 5A to 5C illustrate the operation in the discharge period T0. In the discharge period T0, the transistors M2, M3 and M4 are OFF, whereas the transistor M5 is ON. Since the transistor M4 is OFF, the transistor M1 is disconnected from the power supply line VDD. Thus, the supply of current to the light emitting element 110 is stopped. The light emitting element 110 discharges the charge stored in the capacitor between the anode 110A and the cathode 110C through the power supply line VSS with a potential lower than the potential of the power supply line VDD. As a result, the potential of the node Nd is lowered to the threshold voltage Vtholed of the light emitting element 110. The node Na and node Nb maintain values for the light emission period in the previous cycle.

In the discharge period T0, the pixel circuit 11 stops supplying current from the first power supply which supplies current to flow in the light emitting element 110 to the drive transistor M1. An example of the first power supply is a power supply including the power supply line VDD.

FIGS. 6A to 6C illustrate the initialization period T1. In the initialization period T1, the transistors M2 and M4 are OFF, whereas the transistors M3 and M5 are ON. Since the transistors M3 and M5 are ON in the initialization period T1, electrical connection is made to one electrode ec2 of the capacitor Cst and to the anode electrode 110A of the light emitting element 110. As a result, the potential of the node Na connected to one electrode ec2 of the capacitor Cst is lowered to the same potential as that of the node Nd. That is, the node Na will have the anode potential (Vtholed) of the light emitting element 110. In other words, the potential of one electrode ec2 of the capacitor Cst will be the same potential as the anode potential. The node Nc connected to the other electrode ec1 of the capacitor Cst has the potential VDD based on the power supply line VDD. Thus, charge according to the potential difference VDD−Vtholed is stored in the capacitor Cst. Since the transistor M4 is OFF, the light emitting element 110 is disconnected from the power supply line VDD. As such, no current flows in the light emitting element 110, and no increase occurs in the anode potential (potential of the node Nd). The node Nb maintains the potential in the discharge period T0.

The pixel circuit 11 makes the first control element M4 in the non-conduction state when the current supply to the light emitting element 110 is stopped, and makes the second control element M3 and the third control element M5 in the conduction state when the capacitor is connected to the first electrode.

In the initialization period T1, the pixel circuit 11 stops supplying current to the light emitting element 110 while connecting the capacitor Cst to the first electrode.

FIGS. 7A to 7C illustrate the threshold detection & data storage period T2. In the threshold detection & data storage period T2, the transistors M2 and M3 are ON, whereas the transistors M4 and M5 are OFF. Since the transistor M5 is OFF, the node Na connected to one electrode ec2 of the capacitor Cst is disconnected from the anode electrode 110A (node Nd) of the light emitting element 110. Since the transistor M2 is ON, the source M1S (node Nb) of the transistor M1 is fixed at the data voltage Vdata. On the other hand, the voltage of the gate M1G and the drain M1D of the transistor M1 corresponds to Vtholed. Since Vtholed is lower than Vdata, current according to the potential difference between the gate M1G and the source M1S flows from the data line Vdata to the transistors M2, M1 and M3. Charge is stored in the node Na, to increase the potential thereof. Current keeps flowing in the transistor M1 until the potential difference between the gate M1G (node Na) and the source M1S (node Nb) reaches the threshold voltage of the transistor M1. Assuming here that the threshold voltage of the transistor M1 is Vth(Vth<0), the potential of the node Na will be Vdata+Vth. Moreover, the potential difference in the capacitor Cst is represented by VDD−Vdata−Vth.

In the threshold detection & data storage period T2, the pixel circuit 11 connects the capacitor Cst to the first electrode 110A and thereafter stores the threshold voltage of the drive transistor M1 and the data voltage Vdata corresponding to the emission luminance of the light emitting element 110 in the capacitor Cst.

In the discharge period T0 and the initialization period T1, the pixel circuit 11 turns off the transistor M4 and the transistor M2. The transistor M5 is ON. In the threshold detection & data storage period T2, the transistor M2 is ON, whereas the transistor M5 is OFF. The pixel circuit 11 makes the first control element and the fourth control element in the non-conduction state, and thereafter makes the fourth control element in the conduction state while making the third control element in the non-conduction state.

FIGS. 8A to 8C illustrate the light emission period T3. In the light emission period T3, the transistors M2 and M3 are OFF, whereas the transistors M4 and M5 are ON. Since the transistor M5 is ON, the transistor M1 is connected to the light emitting element 110. Current according to the potential difference between the gate M1G (node Na) and the source M1S (node Nb) of the transistor M1 flows in the transistor M1 and the light emitting element 110. This current allows the light emitting element 110 to emit light. Here, the current flowing in the light emitting element 110 may be obtained by the equation (1) below.

$$Ioled=\beta(Vgs-Vth)^2=\beta(V\text{data}+Vth-VDD-Vth)^2=\beta(V\text{data}-VDD)^2 \qquad \text{equation (1)}$$

$\beta=\mu^*(W/L)^*(Cox/2)$, μ: mobility, w: channel width, L: channel length, Cox: gate capacitance As indicated in the equation (1), the current flowing in the light emitting element 110 is decided by the data voltage Vdata and the power supply line voltage VDD. The current flowing in the light emitting element 110 does not depend on the threshold voltage Vth of the transistor M1. Thus, the current flowing in the light emitting element 110 is not affected by variation in the threshold voltage of the transistor M1.

The pixel circuit 11 includes the capacitor Cst and the drive transistor letting current according to the voltage of the capacitor Cst flow in the light emitting element 110. An example of the drive transistor is the transistor M1. In the light emission period T3, the pixel circuit 11 stores the voltage (VDD-(Vdata+Vth)) subtracting the threshold voltage Vth plus the data voltage Vdata from the voltage of the first power supply VDD in the capacitor Cst, and thereafter disconnects the capacitor Cst from the first electrode 110A while starting to supply current from the first power supply VDD to the drive transistor M1, and further applies the voltage of the capacitor Cst to the gate M1G of the drive transistor M1.

In the threshold detection & data storage period T2, the transistor M2 is made ON. The transistor M5 is made OFF. In the light emission period T3, the transistors M3 and M2 are made OFF, whereas the transistors M4 and M5 are made ON. After making the fourth control element (M2) in the conduction state and making the third control element (M5) in the non-conduction state, the pixel circuit 11 makes the second control element (M3) and the fourth control element (M2) in the non-conduction state, and makes the first control element (M4) and the third control element (M5) in the conduction state.

After the light emission period T3, the cycle returns to the discharge period T0 again. After applying the voltage stored in the capacitor Cst to the gate M1G, the pixel circuit 11 stops supplying current to the light emitting element 110 while discharging the charge stored in the organic light emission layer through the light emitting element 110, and thereafter connects the capacitor Cst to the first electrode 110A and charges the capacitor Cst with a potential of the first electrode 110A obtained after discharge.

In the light emission period T3, the pixel circuit 11 makes the transistor M4 in the ON state. After the light emission period T3, the pixel circuit 11 makes the transistor M4 in the OFF state. After making the current flow in the light emitting element 110, the pixel circuit 11 makes the first control element in the non-conduction state and discharges the charge stored in the light emitting element 110 through the light emitting element 110.

Figure 9:
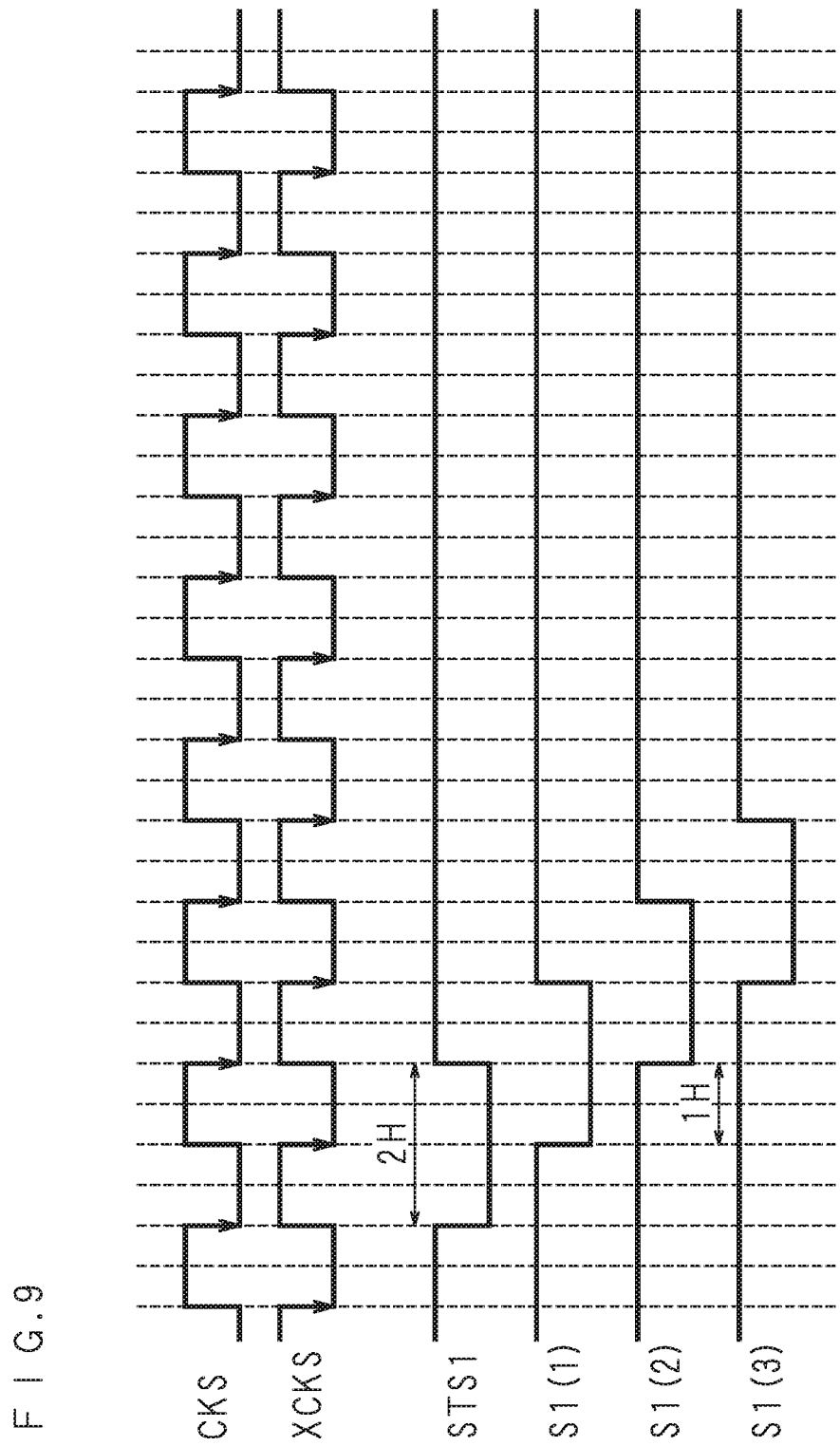
FIG. 9 illustrates the operation of a shift register.

FIG. 9 illustrates the operation of the shift register S1. The shift register S1 outputs the control signal S1(n). The operation clock of the shift register S1 corresponds to two-phase clock signals CKS and XCKS having the cycle of 2 H. At the initial stage of the shift register S1, a start signal STS1 with the pulse width of 2 H is inputted. The shift register S1 propagates the start signal STS1 in synchronization with the fall of the clock signal CKS or the fall of the clock signal XCKS while delaying the start signal STS1 by 1 H. The shift register S1 outputs the start signal STS1 as a control signal S1(2) which is delayed from the control signal S1(1) by the time 1 H. The shift register S1 outputs the start signal STS1 as a control signal S1(3) which is delayed from the control signal S1(2) by the time 1 H. Similar operation follows. The shift register S1 outputs the start signal STS1 as a control signal S1(n) which is delayed from the control signal S1(n-1) by the time 1 H.

Figure 10:
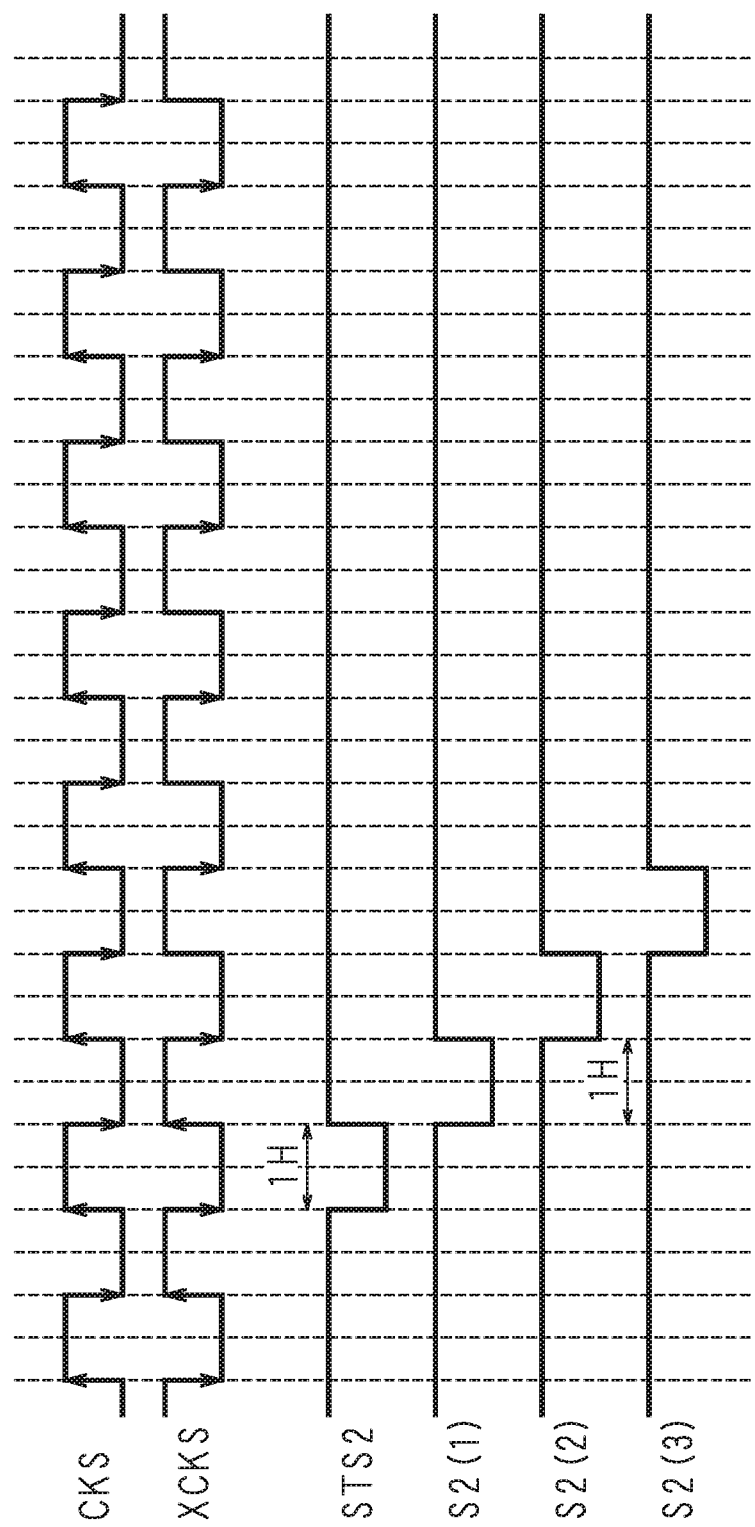
FIG. 10 illustrates the operation of the shift register.

FIG. 10 illustrates the operation of the shift register S2. The shift register S2 outputs the control signal S2(n). The operation clock of the shift register S2 corresponds to two-phase clock signals CKS and XCKS having the cycle of 2 H. At the initial stage of the shift register S2, a start signal STS2 with the pulse width of 1 H is inputted. The shift register S2 propagates the start signal STS2 while being delayed by 1 H in synchronization with the rise or fall of the clock signal CKS, or with the rise or fall of the clock signal XCKS. The shift register S2 outputs the start signal STS2 as a control signal S2(2) which is delayed from the control signal S2(1) by the time 1 H. The shift register S2 outputs the start signal STS2 as a control signal S2(3) which is delayed from the control signal S2(2) by the time 1 H. Similar operation follows. The shift register S2 outputs the start signal STS2 as a control signal S2(n) which is delayed from the control signal S2(n-1) by the time 1 H.

Figure 11:
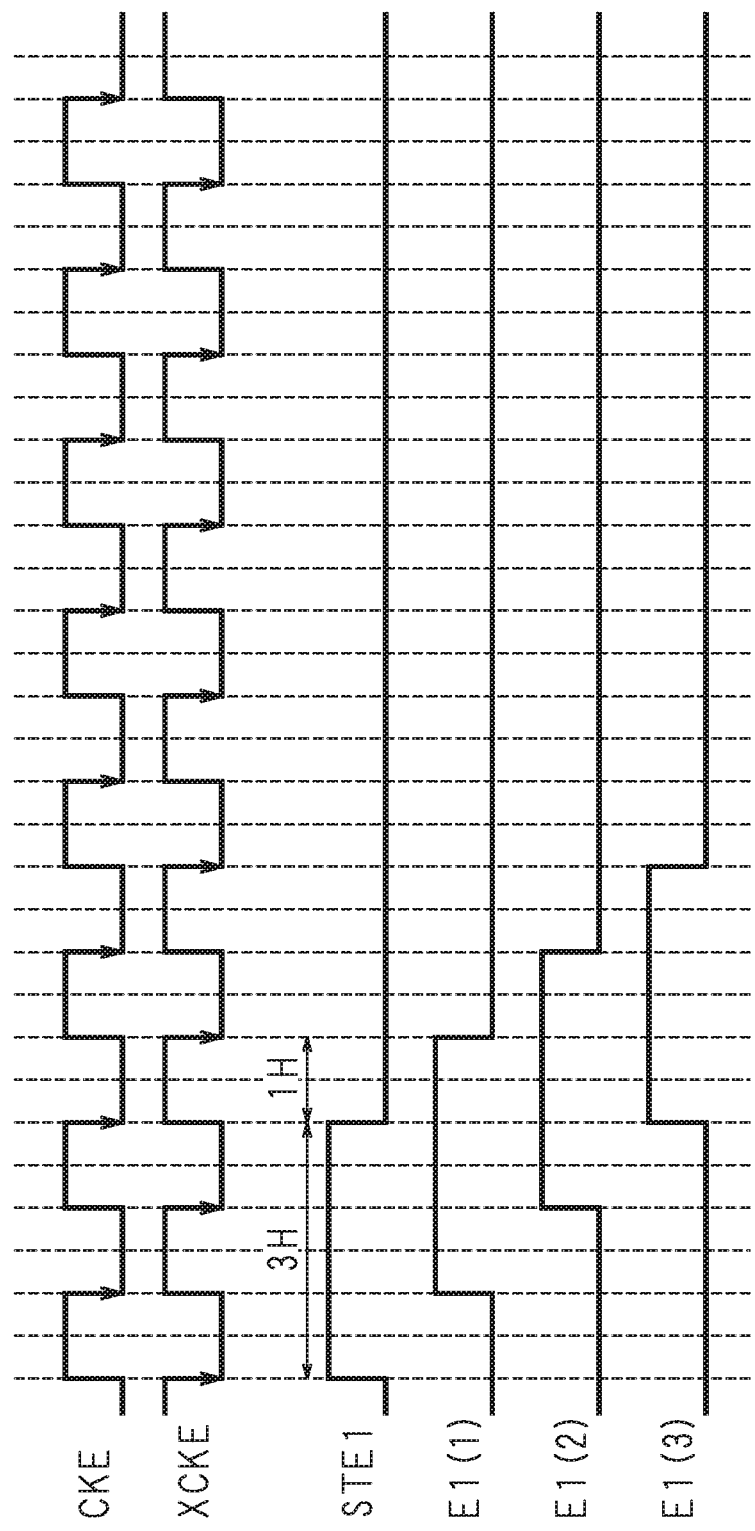
FIG. 11 illustrates the operation of the shift register.

FIG. 11 illustrates the operation of the shift register E1. The shift register E1 outputs the control signal E1(n). The operation clock of the shift register E1 corresponds to two-phase clock signals CKE and XCKE having the cycle of 2 H. At the initial stage of the shift register E1, a start signal STE1 with the pulse width of 3 H is inputted. The shift register E1 propagates the start signal STE1 in synchronization with the fall of the clock signal CKE or the fall of the clock signal XCKE. The shift register E1 outputs the start signal STE1 as a control signal E1(2) which is delayed from the control signal E1(1) by the time 1 H. The shift register E1 outputs the start signal STE1 as a control signal E1(3) which is delayed from the control signal E1(2) by the time 1 H. Similar operation follows. The shift register E1 outputs the start signal STE1 as a control signal E1(n) which is delayed from the control signal E1(n-1) by the time 1 H.

Figure 12:
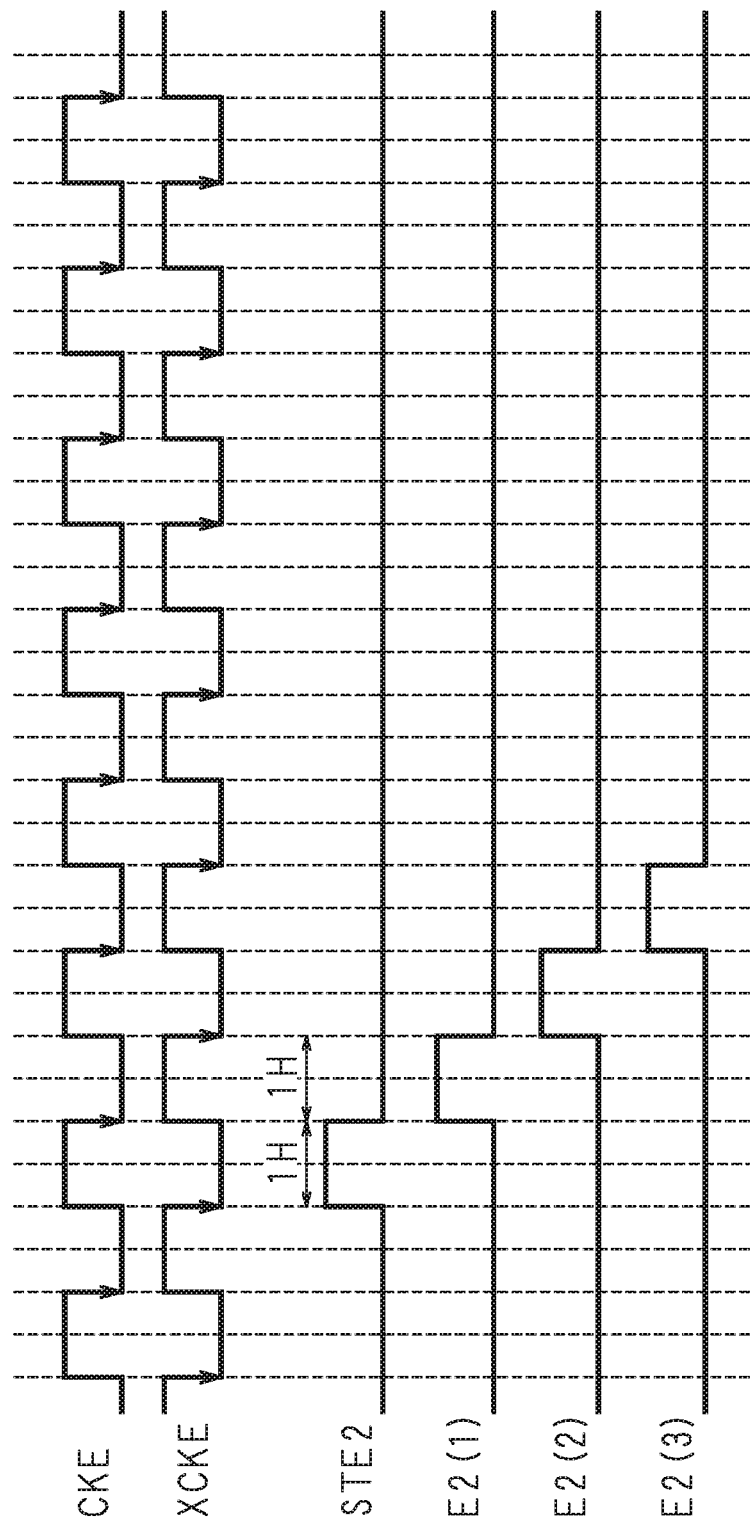
FIG. 12 illustrates the operation of the shift register.

FIG. 12 illustrates the operation of the shift register E2. The shift register E2 outputs the control signal E2(n). The operation clock of the shift register E2 corresponds to two-phase clock signals CKE and XCKE having the cycle of 2 H. At the initial stage of the shift register E2, a start signal STE2 with the pulse width of 1 H is inputted. The shift register E2 propagates the start signal STE2 in synchronization with the fall or rise of the clock signal CKE or with the fall or rise of the clock signal XCKE. The shift register E2 outputs the start signal STE2 as a control signal E2(2) which is delayed from the control signal E2(1) by the time 1 H. The shift register E2 outputs the start signal STE2 as a control signal E2(3) which is delayed from the control signal E2(2) by the time 1 H. Similar operation follows. The shift register E2 outputs the start signal STE2 as a control signal E2(n) which is delayed from the control signal E2(n−1) by the time 1 H. The shift registers S1, S2, E1 and E2 repeat the operation described above.

A purpose of having the discharge period T0 in the present embodiment will now be described. In order to precisely detect the threshold voltage of the transistor M1, the capacitor Cst may preferably be initialized so that the voltage between the gate M1G and the source M1S is equal to or larger than the threshold voltage. In the case of detecting the threshold value of the transistor M1, the source M1S (node Nb) has the data voltage (Vdata). It is thus necessary for the gate M1G (node Na) to be initialized at the voltage lower than the data voltage by the threshold voltage. The potential for initialization needs to be the lowest in the case of the data voltage corresponding to bright light emission. When no margin voltage can be secured under this condition, the threshold detection will not function. This is because no voltage difference as large as that for current to flow is present between the gate M1G and the source M1S at the time of the initialization voltage.

Figure 13:
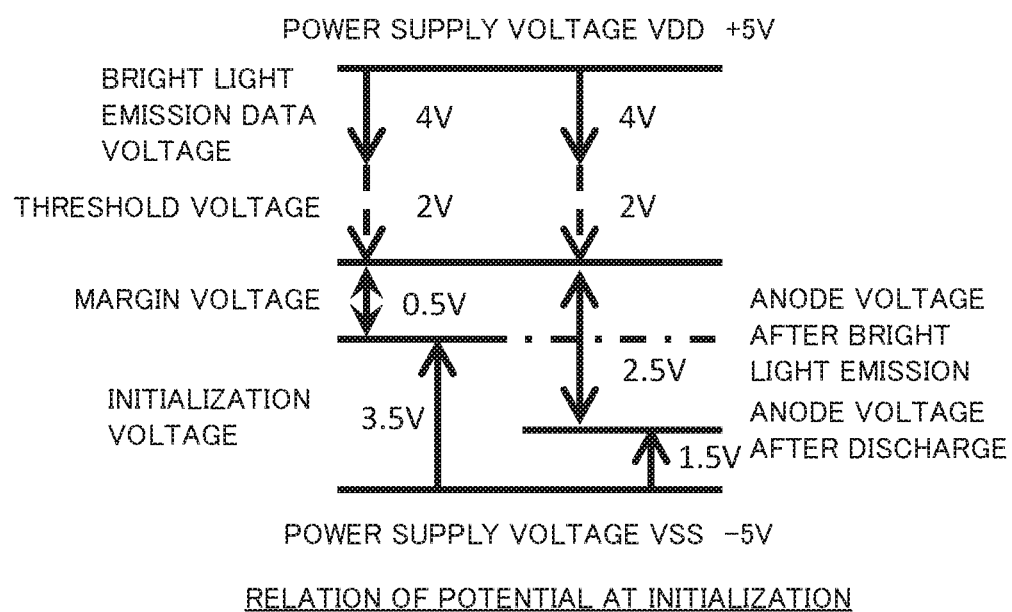
FIG. 13 illustrates expansion of an operation margin.

In the case of using the anode voltage for initialization of the capacitor Cst, the operation margin is narrow when the anode voltage is a high voltage obtained immediately after bright light emission. However, the operation margin is expanded by having a period for discharging the charge stored in the light emitting element 110 to lower the anode voltage to approximately the threshold voltage of the light emitting element 110. FIG. 13 illustrates expansion of the operation margin. It is assumed that the power supply voltage VDD is +5V whereas the power supply voltage VSS is −5V. It is also assumed that the bright light emission data voltage is 4V, whereas the threshold voltage of the drive transistor M1 is 2V. The anode voltage after the bright light emission of the light emitting element 110 is assumed as 3.5V. The threshold voltage Vtholed of the light emitting element 110 is assumed as 1.5V. As illustrated in FIG. 13, when the anode voltage is used as initialization voltage, the operation margin voltage will be 0.5V as illustrated on the left side of FIG. 13. On the other hand, in the case where the discharge period T0 is provided and the threshold voltage Vtholed of the light emitting element 110 is set as the initialization voltage, the margin voltage will be 2.5V. In this example, the operation margin voltage will be increased from 0.5V to 2.5V, i.e., expanded by 2V.

As described above, according to the display apparatus 1, in the initialization period, the potential difference in capacitor is increased by connecting the capacitor Cst to the first electrode.

According to the present embodiment, the following effects are produced. By having the discharge period T0 prior to the initialization period T1, the initialization voltage will be the threshold voltage Vtholed of the light emitting element 110. Accordingly, even when the light emitting element 110 before initialization emits bright light, the voltage thereof may be lowered to the threshold voltage Vtholed. This expands the operation margin for detecting the threshold voltage Vth of the transistor M1. As a result, the threshold voltage Vth may be detected even when it varies due to differences in the threshold voltage Vth or long-time use. Moreover, when the margin expands, it is possible to lower the potential difference between the power supply voltage VDD and VSS. This allows the display apparatus to have reduced consumption power.

In the initialization period, the transistor M1 is disconnected from the power supply line VDD, no current flows in the light emitting element 110. This prevents the light emitting element 110 from emitting light, making it possible to suppress degradation in display quality. Furthermore, as no current flows in the light emitting element 110, the anode potential of the light emitting element 110 will not be increased, which can prevent the degradation in accuracy of detecting the threshold of the transistor M1.

As such, the pixel circuit 11 that can prevent degradation in the display quality as well as degradation in the accuracy of detecting the threshold of the drive transistor M1 may be attained by four transistors and one capacitor. In general, five or more transistors are required in the pixel circuit 11 that prevents degradation in accuracy of detecting the threshold of the drive transistor (for example, six transistors are needed in Japanese Patent Application Laid-Open Publication No. 2005-31630).

However, the pixel circuit 11 according to the present embodiment may be implemented by four transistors and one capacitor, which can reduce the area of the pixel circuit compared to the pixel circuit with five or more transistors or the pixel circuit with two or more capacitors. Since the area of the pixel circuit may be reduced, the pixel area may also be reduced. If the pixel area is reduced, it is possible to increase the number of pixels per unit area, i.e., to have a highly precise structure.

Furthermore, since the anode voltage of the light emitting element 110 is used for initialization of the capacitor Cst, an additional power supply line or signal line for initialization will not be necessary. Thus, the need for the additional power supply line or signal line for initialization in the pixel circuit 11 is eliminated, which contributes to the reduction in the circuit area. As a result, the structure with even higher precision may be attained.

(Second Embodiment)

The second embodiment that is different from the first embodiment described earlier in terms of the interconnections in the pixel circuit 11 will now be described. According to the second embodiment, Bright and Dark of the data voltage supplied from the data driver 14 through the data line Vdata (any one of the data lines D1 to Dm) are inverted from those in the first embodiment.

Figure 14:
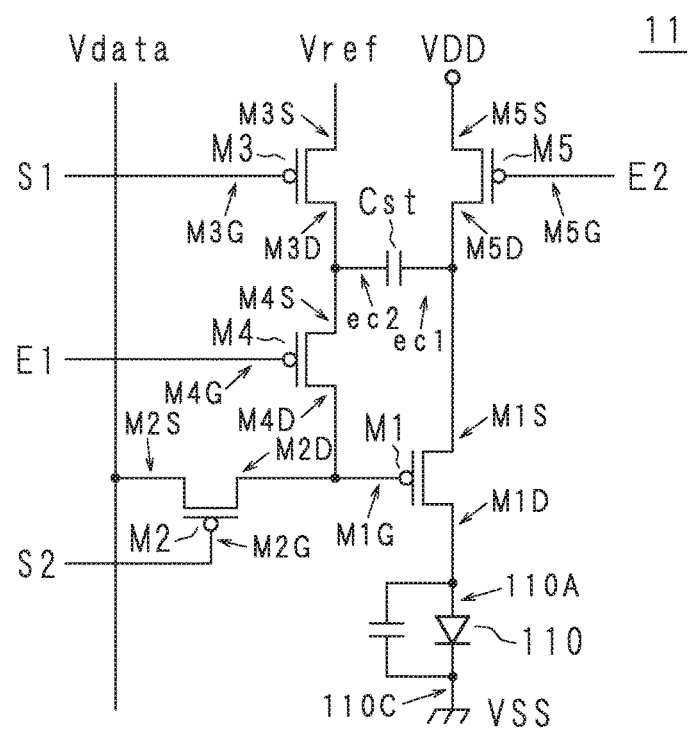
FIG. 14 is a circuit diagram illustrating a configuration example of a pixel circuit according to the second embodiment.

FIG. 14 is a circuit diagram illustrating a configuration example of a pixel circuit 11 according to the second embodiment. In FIG. 14, portions corresponding to those in FIG. 3 are denoted by the same reference characters.

The pixel circuit 11 includes five transistors M1 (drive transistor), M2 (fourth control element), M3 (second control element), M4 (first control element), M5 (third control element), a capacitor Cst, and a light emitting element 110.

A source M1S (third electrode) of the transistor M1 is connected to a drain M5D (sixth electrode) of the transistor M5 and to the other electrode ec1 (tenth electrode) of the capacitor Cst. A drain M1D (fourth electrode) of the transistor M1 is connected to an anode 110A (first electrode) of the light emitting element 110. A gate M1G of the transistor M1 is connected to a drain M2D (eighth electrode) of the transistor M2 and to a drain M4D (sixth electrode) of the transistor M4. A cathode 110C (second electrode) of the light emitting element 110 is connected to a power supply line VSS.

The drain M2D of the transistor M2 is connected to the gate M1G of the transistor M1 and to the drain M4D of the transistor M4. A source M2S (seventh electrode) of the transistor M2 is connected to a data line Vdata. The control signal (scanning signal) S2 is inputted to ae gate M2G of the transistor M2.

A drain M3D (sixth electrode) of the transistor M3 is connected to a source M4S (fifth electrode) of the transistor M4 and to one electrode ec2 (ninth electrode) of the capacitor Cst. A source M3S (fifth electrode) of the transistor M3 is connected to a reference voltage source Vref. The control signal (scanning signal) S1 is inputted to a gate M3G of the transistor M3.

The source M4S of the transistor M4 is connected to the drain M3D of the transistor M3 and to one electrode ec2 of the capacitor Cst. The drain M4D of the transistor M4 is connected to the gate M1G of the transistor M1 and to the drain M2D of the transistor M2. The control signal (light emission control signal) E1 is inputted to the gate M4G of the transistor M4.

The drain M5D of the transistor M5 is connected to the source M1S of the transistor M1 and to the other electrode ec1 of the capacitor Cst. A source M5S (fifth electrode) of the transistor M5 is connected to the first power supply VDD. The control signal (light emission control signal) E2 is inputted to the gate M5G of the transistor M5.

Figure 15:
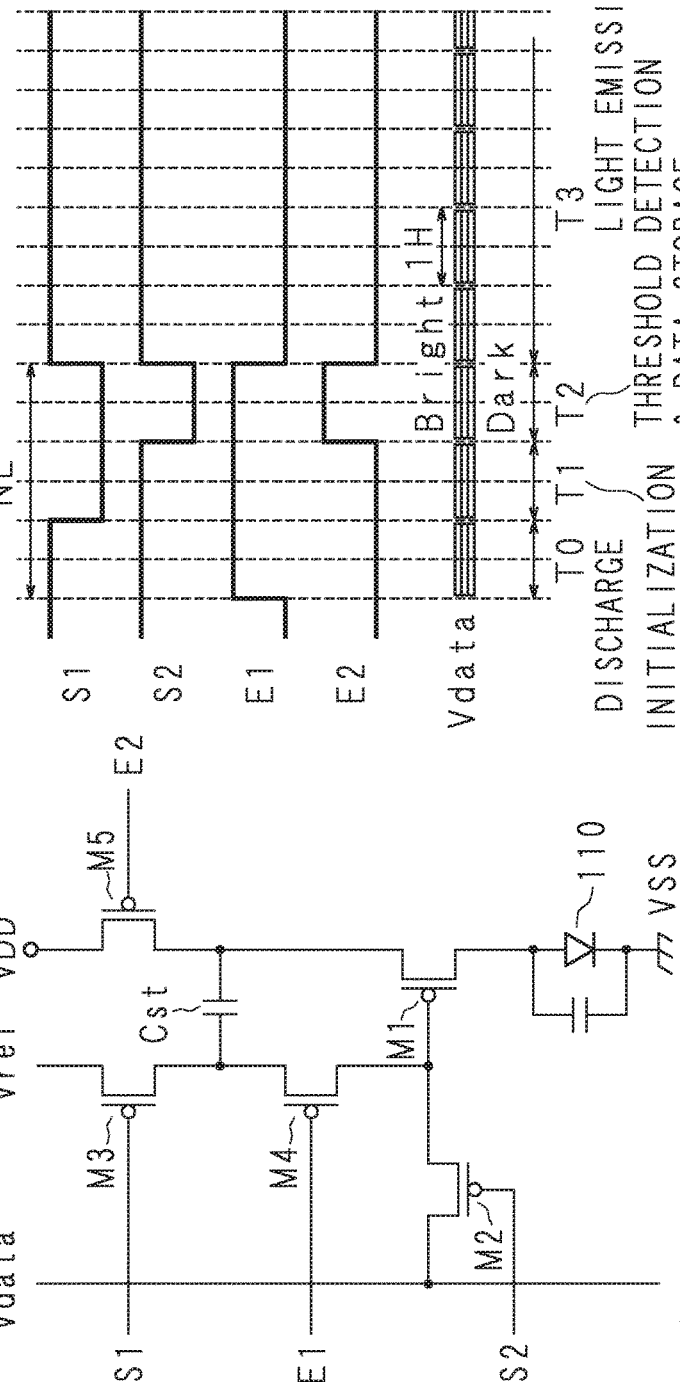
FIGS. 15A to 15C illustrate the operation of the pixel circuit according to the second embodiment.

FIGS. 15A to 15C illustrate the operation of the pixel circuit 11 according to the second embodiment. FIG. 15A is a circuit diagram illustrating the pixel circuit 11 similar to that in FIG. 14. FIG. 15B is a table illustrating the relationship of ON and OFF in the transistors M2 to M5 during different periods for the pixel circuit 11. FIG. 15C is a graph illustrating changes in control signals in the different operation periods for the pixel circuit 11 and a data signal in time series.

According to the second embodiment, as illustrated in FIG. 15B, the timings of switching the transistors M2, M3, M4 and M5 between ON and OFF are the same as those in the first embodiment (see FIG. 4B). Moreover, according to the second embodiment, as illustrated in FIG. 15C, the pattern of high/low for each of the control signals S1, S2, E1 and E2 is the same as that in the first embodiment (see FIG. 4C). In the second embodiment, however, Bright and Dark of the data voltage Vdata are inverted from those in the first embodiment (see FIG. 4C), as illustrated in FIG. 15C.

In the discharge period T0 and the initialization period T1, the transistor M4 for fixing the potential of the gate M1G of the transistor M1 which is a drive transistor is OFF, which also makes the transistor M1 in the OFF state, thereby not charging the light emitting element 110 through the transistor M1. As a result, the potential of the anode 110A of the light emitting element 110 is lowered to the threshold voltage Vtholed, preventing unnecessary light emission.

(Third Embodiment)

The third embodiment that is different from the first embodiment described earlier in terms of the interconnections in the pixel circuit 11 will now be described. In the third embodiment, all the TFTs used here are constituted by N-type TFTs.

Figure 16:
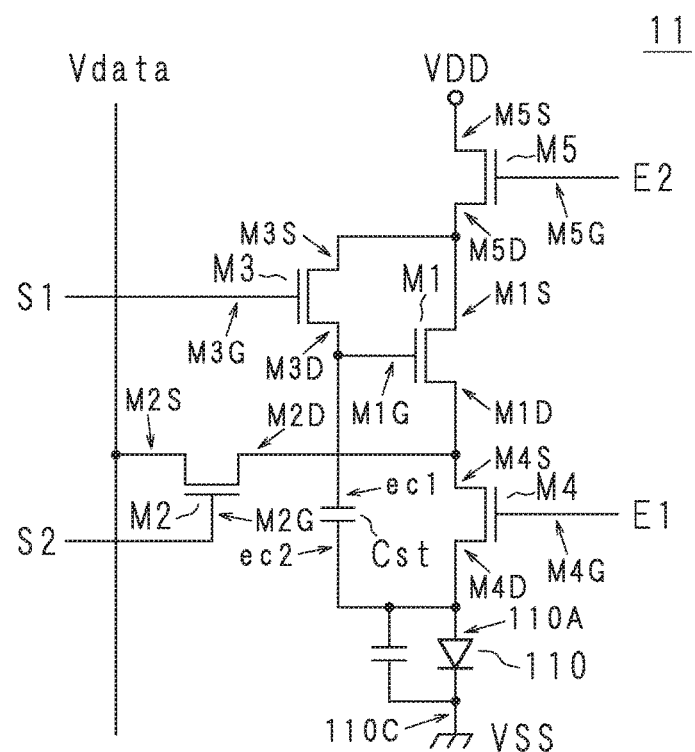
FIG. 16 is a circuit diagram illustrating a configuration example of a pixel circuit according to the third embodiment.

FIG. 16 is a circuit diagram illustrating a configuration example of a pixel circuit 11 according to the third embodiment. In FIG. 16, portions corresponding to those in FIG. 3 are denoted by the same reference characters.

The pixel circuit 11 includes five transistors M1 (drive transistor), M2 (fourth control element), M3 (second control element), M4 (first control element), M5 (third control element), a capacitor Cst, and a light emitting element 110.

A gate M1G of the transistor M1 is connected to a drain M3D (sixth electrode) of the transistor M3 and to the other electrode ec1 (tenth electrode) of the capacitor Cst. A source M1S (third electrode) of the transistor M1 is connected to a source M3S (fifth electrode) of the transistor M3 and to a drain M5D (sixth electrode) of the transistor M5. A drain M1D (fourth electrode) of the transistor M1 is connected to a drain M2D (eighth electrode) of the transistor M2 and to a source M4S (fifth electrode) of the transistor M4.

The drain M2D of the transistor M2 is connected to the drain M1D of the transistor M1 and to the source M4S of the transistor M4. A source M2S (seventh electrode) of the transistor M2 is connected to a data line Vdata. The control signal (scanning signal) S2 is inputted to a gate M2G of the transistor M2.

The source M3S of the transistor M3 is connected to the source M1S of the transistor M1 and to the drain M5D of the transistor M5. A drain M3D of the transistor M3 is connected to the gate M1G of the transistor M1 and to the other electrode ec1 of the capacitor Cst. The control signal (scanning signal) S1 is inputted to a gate M3G of the transistor M3.

The source M4S of the transistor M4 is connected to the drain M1D of the transistor M1 and to the drain M2D of the transistor M2. A drain M4D (sixth electrode) of the transistor M4 is connected to an anode 110A (first electrode) of the light emitting element 110 and to one electrode ec2 (ninth electrode) of the capacitor Cst. The control signal (light emission control signal) E1 is inputted to a gate M4G of the transistor M4. A cathode 110C (second electrode) of the light emitting element 110 is connected to a power supply line VSS.

The drain M5D of the transistor M5 is connected to the source M1S of the transistor M1 and to the source M3S of the transistor M3. A source M5S (fifth electrode) of the transistor M5 is connected to a first power supply VDD. The control signal (light emission control signal) E2 is inputted to a gate M5G of the transistor M5.

Figure 17:
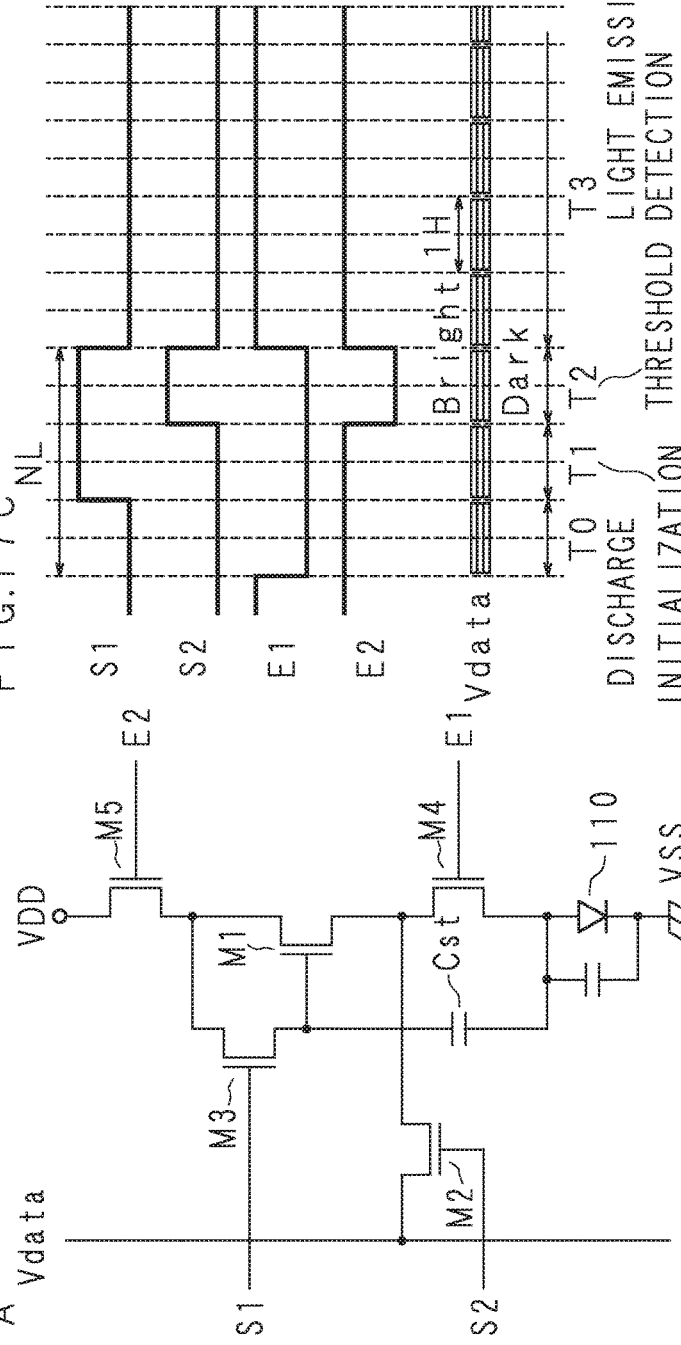
FIGS. 17A to 17C illustrate the operation of the pixel circuit according to the third embodiment.

FIGS. 17A to 17C illustrate the operation of the pixel circuit 11 according to the third embodiment. FIG. 17A is a circuit diagram illustrating the pixel circuit 11 similar to that in FIG. 16. FIG. 17B is a table illustrating the relationship of ON and OFF in the transistors M2 to M5 during different periods for the pixel circuit 11. FIG. 17C is a graph illustrating changes in control signals in the different operation periods for the pixel circuit 11 and a data signal in time series.

According to the third embodiment, as illustrated in FIG. 17B, the timings of switching the transistors M2, M3, M4 and M5 between ON and OFF are the same as those in the first embodiment (see FIG. 4B). In the third embodiment, however, each of the control signals S1, S2, E1 and E2 is an active high signal as illustrated in FIG. 17C. That is, when the control signals S1, S2, E1 and E2 have the values of high (H), the respective transistors M3, M2, M4 and M5 are ON accordingly. When the control signals S1, S2, E1 and E2 have the values of low (L), the respective transistors M3, M2, M4 and M5 are OFF accordingly. Moreover, in the third embodiment, Bright and Dark of the data voltage Vdata are inverted from those in the first embodiment (see FIG. 4C), as illustrated in FIG. 17C.

Since the transistor M4 is OFF during the discharge period T0 and the initialization period T1, the potential of the anode 110A of the light emitting element 110 is lowered to the threshold voltage Vtholed, and the potential of one electrode ec2 of the capacitor Cst is initialized to Vtholed.

(Fourth Embodiment)

The fourth embodiment that is different from the first embodiment described earlier in terms of the interconnections in the pixel circuit 11 will now be described. In the fourth embodiment, all the TFTs used here are constituted by N-type TFTs.

Figure 18:
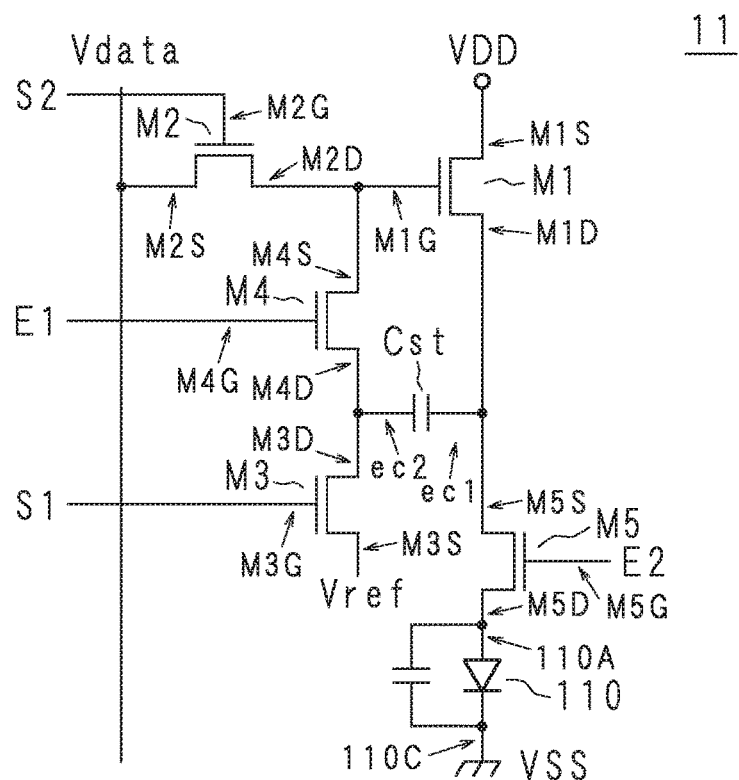
FIG. 18 is a circuit diagram illustrating a configuration example of a pixel circuit according to the fourth embodiment.

FIG. 18 is a circuit diagram illustrating a configuration example of a pixel circuit 11 according to the fourth embodiment. In FIG. 18, portions corresponding to those in FIG. 3 are denoted by the same reference characters.

A gate M1G of the transistor M1 is connected to a drain M2D (eighth electrode) of the transistor M2 and to a source M4S (fifth electrode) of the transistor M4. A drain M1D (fourth electrode) of the transistor M1 is connected to a source M5S (fifth electrode) of the transistor M5 and to the other electrode ec1 (tenth electrode) of the capacitor Cst. A source M1S (third electrode) of the transistor M1 is connected to a first power supply VDD.

A drain M2D of the transistor M2 is connected to the gate M1G of the transistor M1 and to the source M4S of the transistor M4. A source M2S (seventh electrode) of the transistor M2 is connected to a data line Vdata. The control signal (scanning signal) S2 is inputted to a gate M2G of the transistor M2.

A drain M3D (sixth electrode) of the transistor M3 is connected to a drain M4D (sixth electrode) of the transistor M4 and to one electrode ec2 (ninth electrode) of the capacitor Cst. A source M3S (fifth electrode) of the transistor M3 is connected to a reference voltage source Vref. The control signal (scanning signal) S1 is inputted to a gate M3G of the transistor M3.

The source M4S of the transistor M4 is connected to the gate MIG of the transistor M1 and to the drain M2D of the transistor M2. The drain M4D of the transistor M4 is connected to the drain M3D of the transistor M3 and to one electrode ec2 of the capacitor Cst. The control signal (light emission control signal) E1 is inputted to a gate M4G of the transistor M4.

The source M5S of the transistor M5 is connected to the drain M1D of the transistor M1 and to the other electrode ec1 of the capacitor Cst. A drain M5D (sixth electrode) of the transistor M5 is connected to an anode 110A (first electrode) of the light emitting element 110. The control signal (light emission control signal) E2 is inputted to a gate M5G of the transistor M5. A cathode 110C (second electrode) of the light emitting element 110 is connected to a power supply line VSS.

FIGS. 19A to 19C illustrate the operation of the pixel circuit 11 according to the fourth embodiment. FIG. 19A is a circuit diagram illustrating the pixel circuit 11 similar to that in FIG. 18. FIG. 19B is a table illustrating the relationship of ON and OFF in the transistors M2 to M5 during different periods for the pixel circuit 11. FIG. 19C is a graph illustrating changes in control signals in the different operation periods for the pixel circuit 11 and a data signal in time series.

According to the fourth embodiment, as illustrated in FIG. 19B, the timings of switching the transistors M2, M3, M4 and M5 between ON and OFF are the same as those in the first embodiment (see FIG. 4B). In the fourth embodiment, however, each of the control signals S1, S2, E1 and E2 is an active high signal as illustrated in FIG. 19C. That is, when the control signals S1, S2, E1 and E2 have the values of high (H), the respective transistors M3, M2, M4 and M5 are ON accordingly. When the control signals S1, S2, E1 and E2 have the values of low (L), the respective transistors M3, M2, M4 and M5 are OFF accordingly.

During the discharge period T0 and the initialization period T1, the transistor M4 for fixing the potential of the gate M1G of the transistor M1 which is the drive transistor is OFF, thereby not charging the light emitting element 110 through the transistor M1. The potential of the anode 110A of the light emitting element 110 is lowered to the threshold voltage Vtholed, and the other electrode ec1 of the capacitor Cst is initialized to Vtholed.

The technical features (components) described in each embodiment may be combined with one another, and such combinations may form new technical features.

It should be understood that the embodiments disclosed herein are illustrative and non-restrictive in every respect. Since the scope of the present invention is defined by the appended claims rather than by the description preceding them, all changes that fall within metes and bounds of the claims, or equivalence of such metes and bounds thereof are therefore intended to be embraced by the claims.

What is claimed is:

1. A display apparatus, comprising:
a light emitting element including a first electrode, a second electrode, and an organic light emitting layer disposed between the first electrode and the second electrode; and
a pixel circuit including a capacitor and a drive transistor letting current according to voltage of the capacitor flow in the light emitting element,
wherein the pixel circuit stops supply of current to the light emitting element while connecting the capacitor to the first electrode and the capacitor is initialized by applying a potential of the first electrode of the light emitting element to the capacitor, and
wherein, after the initialization of the capacitor, the pixel circuit disconnects the capacitor from the first electrode to store threshold voltage of the drive transistor and data voltage corresponding to emission luminance of the light emitting element in the capacitor.

2. The display apparatus according to claim 1, wherein in a case of stopping the supply of current, the pixel circuit stops supplying current from a first power supply which supplies current to flow in the light emitting element to the drive transistor.

3. The display apparatus according to claim 2, wherein after storing, in the capacitor, voltage subtracting the threshold voltage plus the data voltage from voltage of the first power supply, the pixel circuit disconnects the capacitor from the first electrode while starting to supply current from the first power supply to the drive transistor, and further applies voltage of the capacitor to a gate of the drive transistor.

4. The display apparatus according to claim 3, wherein after applying the voltage stored in the capacitor to the gate, the pixel circuit stops supply of current to the light emitting element while discharging charge stored in the organic light emitting layer through the light emitting element, and thereafter connects the capacitor to the first electrode and charges the capacitor with a potential of the first electrode obtained after discharge.

5. The display apparatus according to claim 1,
wherein the drive transistor has a third electrode and a fourth electrode, and controls current to flow between the third electrode and the fourth electrode in accordance with voltage applied to a gate of the drive transistor, wherein the pixel circuit further includes a first control element to a third control element, each of the first to third control elements including a fifth electrode and a sixth electrode and controlling conduction state of the fifth electrode and the sixth electrode, wherein the fifth electrode of the first control element is connected to a first power supply which supplies current to flow in the light emitting element, whereas the sixth electrode of the first control element is connected to the third electrode, wherein the fifth electrode of the second control element is connected to the gate and the capacitor, whereas the sixth electrode of the second control element is connected to the fourth electrode, wherein the fifth electrode of the third control element is connected to the fourth electrode and to the sixth electrode of the second control element, whereas the sixth electrode of the third control element is connected to the first electrode, and wherein the pixel circuit makes the first control element in a non-conduction state in a case of stopping the supply of current to the light emitting element, and makes the second control element and the third control element in a conduction state in a case of connecting the capacitor to the first electrode.

6. The display apparatus according to claim 5,
wherein the pixel circuit further includes a fourth control element including a seventh electrode connected to a data line which supplies data voltage according to emission luminance of the light emitting element and an eighth electrode connected to the third electrode, the fourth control element controlling conduction state of the seventh electrode and the eighth electrode, and
wherein the pixel circuit makes the fourth control element in a non-conduction state.

7. The display apparatus according to claim 6,
wherein the pixel circuit makes the first control element and the fourth control element in a non-conduction state, and thereafter makes the fourth control element in a conduction state and makes the third control element in a non-conduction state.

8. The display apparatus according to claim 7,
wherein the pixel circuit makes the fourth control element in a conduction state and makes the third control element in a non-conduction state, and thereafter makes the second control element and the fourth control element in a non-conduction state, and makes the first control element and the third control element in a conduction state.

9. The display apparatus according to claim 8,
wherein, after current flows in the light emitting element, the pixel circuit makes the first control element in a non-conduction state and discharges charge stored in the light emitting element through the light emitting element.

10. The display apparatus according to claim 1,
wherein the capacitor includes a third electrode, and a fourth electrode connected to a predetermined potential, and
wherein the pixel circuit connects the first electrode to the third electrode.

11. The display apparatus according to claim 5,
wherein the capacitor includes a ninth electrode, and a tenth electrode connected to a predetermined potential, and
wherein the fifth electrode of the second control element is connected to the ninth electrode.

12. The display apparatus according to claim 1, wherein the pixel circuit is not connected to a power supply to which a voltage is applied when the pixel circuit connects the capacitor and the first electrode and the capacitor is initialized by applying only the potential of the second electrode of the light emitting element to the capacitor.

13. A display apparatus, comprising:
a light emitting element including a first electrode, a second electrode, and an organic light emitting layer disposed between the first electrode and the second electrode; and
a pixel circuit including a capacitor and a drive transistor letting current according to voltage of the capacitor flow in the light emitting element,
wherein the drive transistor has a third electrode and a fourth electrode, and controls current to flow between the third electrode and the fourth electrode in accordance with voltage applied to a gate of the drive transistor,
wherein the pixel circuit further includes a first control element to a third control element, each of the first to third control elements including a fifth electrode and a sixth electrode and controlling conduction state of the fifth electrode and the sixth electrode, and a fourth control element having a seventh electrode and an eighth electrode and controlling conduction state of the seventh electrode and the eighth electrode,
wherein the fourth electrode of the drive transistor is connected to the first electrode,
wherein the fifth electrode of the first control element is connected to the capacitor, whereas the sixth electrode of the first control element is connected to the gate,
wherein the fifth electrode of the second control element is connected to a reference power supply, whereas the sixth electrode of the second control element is connected to the capacitor and to the fifth electrode of the first control element,
wherein the fifth electrode of the third control element is connected to a first power supply which supplies current to flow in the light emitting element, whereas the sixth electrode of the third control element is connected to the capacitor and to the fourth electrode, and
wherein the seventh electrode of the fourth control element is connected to a data line supplying data voltage according to emission luminance of the light emitting element, whereas the eighth electrode of the fourth control element is connected to the gate and to the sixth electrode of the first control element.

14. A display apparatus, comprising:
a light emitting element including a first electrode, a second electrode, and an organic light emitting layer disposed between the first electrode and the second electrode; and
a pixel circuit including a capacitor and a drive transistor letting current according to voltage of the capacitor flow in the light emitting element,
wherein the drive transistor has a third electrode and a fourth electrode, and controls current to flow between the third electrode and the fourth electrode in accordance with voltage applied to a gate of the drive transistor,
wherein the pixel circuit further includes a first control element to a third control element, each of the first to third control elements including a fifth electrode and a sixth electrode and controlling conduction state of the fifth electrode and the sixth electrode, and a fourth control element having a seventh electrode and an eighth electrode and controlling conduction state of the seventh electrode and the eighth electrode, wherein the fifth electrode of the first control element is connected to the fourth electrode, whereas the sixth electrode of the first control element is connected to the capacitor and to the first electrode, wherein the sixth electrode of the second control element is connected to the capacitor and to the gate, wherein the fifth electrode of the third control element is connected to a first power supply which supplies current to flow in the light emitting element, whereas the sixth electrode of the third control element is connected to the third electrode and to the fifth electrode of the second control element, and wherein the seventh electrode of the fourth control element is connected to a data line supplying data voltage according to emission luminance of the light emitting element, whereas the eighth electrode of the fourth control element is connected to the fourth electrode and to the fifth electrode of the first control element.

15. A display apparatus, comprising:

a light emitting element including a first electrode, a second electrode, and an organic light emitting layer disposed between the first electrode and the second electrode; and a pixel circuit including a capacitor and a drive transistor letting current according to voltage of the capacitor flow in the light emitting element, wherein the drive transistor has a third electrode and a fourth electrode, and controls current to flow between the third electrode and the fourth electrode in accordance with voltage applied to a gate of the drive transistor, wherein the pixel circuit further includes a first control element to a third control element, each of the first to third control elements including a fifth electrode and a sixth electrode and controlling conduction state of the fifth electrode and the sixth electrode, and a fourth control element having a seventh electrode and an eighth electrode and controlling conduction state of the seventh electrode and the eighth electrode, wherein the third electrode of the drive transistor is connected to a first power supply which supplies current to flow in the light emitting element, wherein the fifth electrode of the first control element is connected to the gate, whereas the sixth electrode of the first control element is connected to the capacitor, wherein the fifth electrode of the second control element is connected to a reference power supply, whereas the sixth electrode of the second control element is connected to the capacitor and to the sixth electrode of the first control element, wherein the fifth electrode of the third control element is connected to the capacitor and to the fourth electrode, whereas the sixth electrode of the third control element is connected to the first electrode, and wherein the seventh electrode of the fourth control element is connected to a data line supplying data voltage according to emission luminance of the light emitting element, whereas the eighth electrode of the fourth control element is connected to the gate and to the fifth electrode of the first control element.

* * * * *